(12) United States Patent
Tanaka et al.

(10) Patent No.: US 6,530,991 B2
(45) Date of Patent: Mar. 11, 2003

(54) METHOD FOR THE FORMATION OF SEMICONDUCTOR LAYER

(75) Inventors: Satoru Tanaka, 2-3-3-2, 1-Jo 13-chome, Miyanomori, Chuo-ku, Sapporo-shi, Hokkaido 064-0951 (JP); Misaichi Takeuchi, Fujimi (JP); Yoshinobu Aoyagi, Wako (JP)

(73) Assignees: Riken, Saitama (JP); Satoru Tanaka, Hokkaido (JP)

( * ) Notice: Subject to any disclaimer, the term of this patent is extended or adjusted under 35 U.S.C. 154(b) by 0 days.

(21) Appl. No.: 09/734,651

(22) Filed: Dec. 13, 2000

(65) Prior Publication Data

US 2001/0012678 A1 Aug. 9, 2001

(30) Foreign Application Priority Data

Dec. 14, 1999 (JP) .......................................... 11-354563

(51) Int. Cl.$^7$ ............................ C30B 25/02; C30B 29/38
(52) U.S. Cl. .............................. 117/89; 117/90; 117/94; 117/95; 117/96; 117/103; 117/106; 117/951
(58) Field of Search ............................. 117/951, 89, 90, 117/94, 95, 96, 103, 106

(56) References Cited

U.S. PATENT DOCUMENTS

| | | | | |
|---|---|---|---|---|
| 5,290,393 A | * | 3/1994 | Nakamura | 117/951 |
| 5,834,331 A | * | 11/1998 | Razeghi | 438/40 |
| 5,977,612 A | * | 11/1999 | Bour et al. | 257/618 |
| 6,136,623 A | * | 10/2000 | Hofstetter et al. | 438/28 |
| 6,215,803 B1 | * | 4/2001 | Hata | |

FOREIGN PATENT DOCUMENTS

| | | |
|---|---|---|
| JP | 01-315127 | 12/1989 |
| JP | 03-161922 | 7/1991 |
| JP | 04-088627 | 3/1992 |
| JP | 04-106916 | 4/1992 |
| JP | 04-199812 | 7/1992 |
| JP | 06-005523 | 1/1994 |
| JP | 09-219540 | 8/1997 |
| JP | 09-232629 | 9/1997 |
| JP | 2000-150388 | 5/2000 |
| JP | 2000-340511 | 12/2000 |
| WO | 00/33364 | * 6/2000 |

OTHER PUBLICATIONS

Lahreche et al., "Growth of high–quality GaN by low–pressure metal organic vapour phase epitaxy (LP–MOVPE) from 3D islands and lateral overgrowth," Journal of Crystal Growth, vol. 205 (1999) pp. 245–252.

* cited by examiner

Primary Examiner—Robert Kunemund
(74) Attorney, Agent, or Firm—Birch, Stewart, Kolasch & Birch, LLP

(57) ABSTRACT

A method for the formation of a semiconductor layer by which a defect density of structural defects, particularly a dislocation density of threading dislocations in the resulting semiconductor layer can be remarkably reduced, so that hours of work can be shortened as well as a manufacturing cost can be reduced without requiring any complicated process comprises supplying a structural defect suppressing material for suppressing structural defects in the semiconductor layer onto a surface of the layer of a material from which the semiconductor layer is to be formed.

4 Claims, 14 Drawing Sheets

GaN/AlN GROWTH OF BUFFER LAYER

SUPPLY OF STRUCTURAL DEFECT SUPPRESSING MATERIAL

GROWTH OF GaN

FORMATION OF GaN LAYER

FIG. 4

| | | |
|---|---|---|
| (a) | IN CASE OF FORMING AlN THIN FILM 12 ON 6H-SiC(0001) | TEMPERATURE IN REACTOR: 1100°C<br>PRESSURE IN REACTOR: 76 Torr<br>RAW MATERIAL GAS: $NH_3$/TMA<br>$=0.09$(mol/min)/$2.2(\mu$ mol/min)<br>$=\sim 40000$<br>GAS SUPPLY: SIMULTANEOUS/ALTERNATE SUPPLY<br>FILM THICKNESS: $\sim$1–2nm |
| (b) | IN CASE OF FORMING GaN LAYER 14 ON AlN THIN FILM 12 | TEMPERATURE IN REACTOR: 1080°C<br>PRESSURE IN REACTOR: 76 Torr<br>RAW MATERIAL GAS: $NH_3$/TMG<br>$=0.09$(mol/min)/$48(\mu$ mol/min)<br>$=1875$<br>GAS SUPPLY: SIMULTANEOUS SUPPLY<br>FILM THICKNESS: $\sim 0.5\mu$m |
| (c) | IN CASE OF SUPPLYING TESi ON GaN LAYER 14 | TEMPERATURE IN REACTOR: 1080°C<br>PRESSURE IN REACTOR: 76 Torr<br>RAW MATERIAL GAS: TESi (HYDROGEN CARRIER)<br>$=32$nmol (96nmol/min) |
| (d) | IN CASE OF SUPPLYING TRIMETHYLGALLIUM (TMG) AND AMMONIA ($NH_3$) | TEMPERATURE IN REACTOR: 1080°C<br>PRESSURE IN REACTOR: 76 Torr<br>RAW MATERIAL GAS: TMG SUPPLY RATE<br>(HYDROGEN CARRIER)<br>$46\mu$ mol/min<br>: $NH_3$ SUPPLY AMOUNT 2SLM<br>GAS SUPPLY TIME: 15 min |

FIG. 7(a)

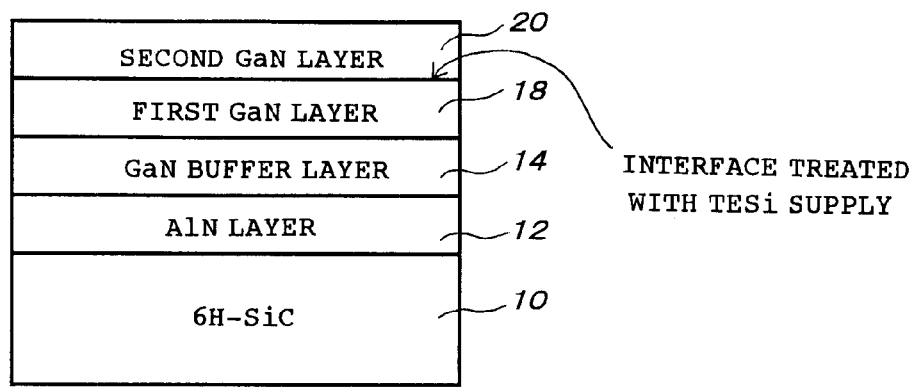

| | | |
|---|---|---|
| SECOND GaN LAYER | 20 | |
| FIRST GaN LAYER | 18 | } INTERFACE TREATED WITH TESi SUPPLY |
| GaN BUFFER LAYER | 14 | |
| AlN LAYER | 12 | |
| 6H-SiC | 10 | |

FIG. 7(b)

| | | |
|---|---|---|
| (b-1) | IN CASE OF SUPPLYING Si | TEMPERATURE: 1080 DEGREES<br>PRESSURE: 76 Torr<br>TESi SUPPLY AMOUNT<br>(HYDROGEN CARRIER):32nmol(96nmol/min.) |
| (b-2) | IN CASE OF GROWTH OF GaN | TEMPERATURE: 1080 DEGREES<br>PRESSURE: 76 Torr<br>TMG SUPPLY RATE<br>(HYDROGEN CARRIER):46 $\mu$ mol/min.<br>$NH_3$ SUPPLY AMOUNT:2SLM |

FIG. 8(a-1)
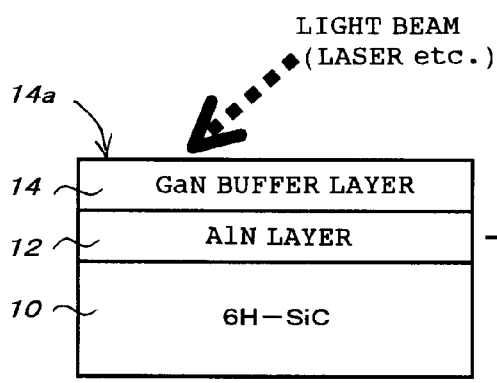
FIG. 8(a-2)
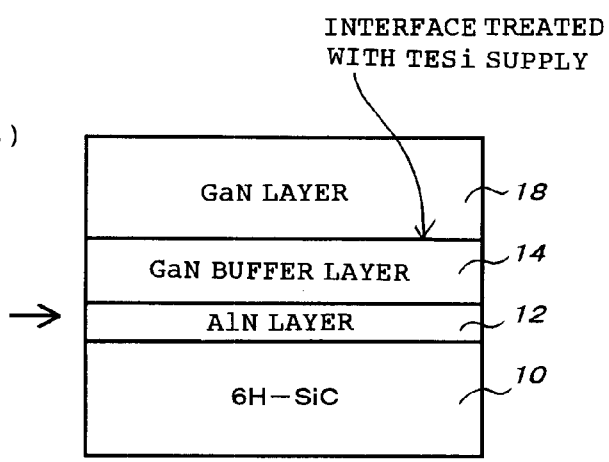
FIG. 8(b)
| IN CASE OF SUPPLYING Si | TEMPERATURE: 1080 DEGREES<br>PRESSURE: 76 Torr<br>TESi SUPPLY AMOUNT<br>(HYDROGEN CARRIER):32nmol(96nmol/min.)<br>LIGHT BEAM OUTPUT CONDITION;<br>CONTINUOUS OUTPUT BY MERCURY LAMP IN<br>0.1 pJ/cm² INTENSITY DURING TESi SUPPLY |
|---|---|

FIG. 9(a-1)
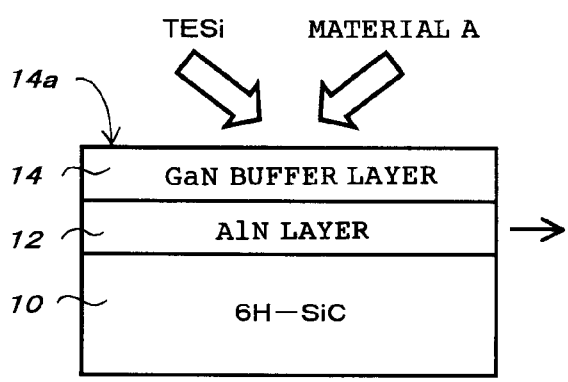
FIG. 9(a-2)
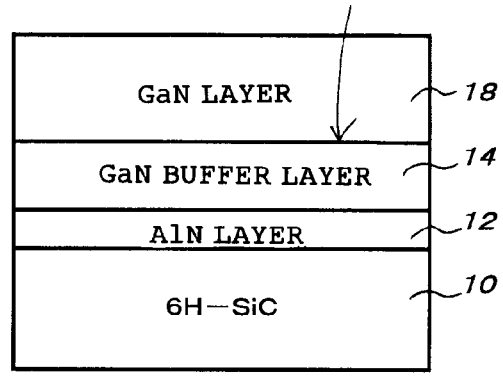
FIG. 9(b)
| IN CASE OF SUPPLYING Si | TEMPERATURE: 1080 DEGREES<br>PRESSURE: 76 Torr<br>TESi SUPPLY AMOUNT<br>(HYDROGEN CARRIER):32nmol(96nmol/min.) |
|---|---|
| ANOTHER ATOM | In (SUPPLY WITH TMIn);1nmol |

FIG. 11(a)
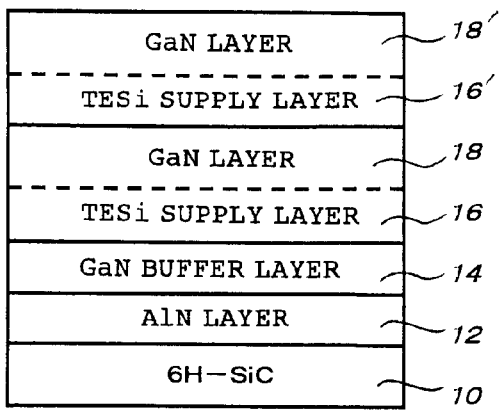
FIG. 11(b-1) FIG. 11(b-2)
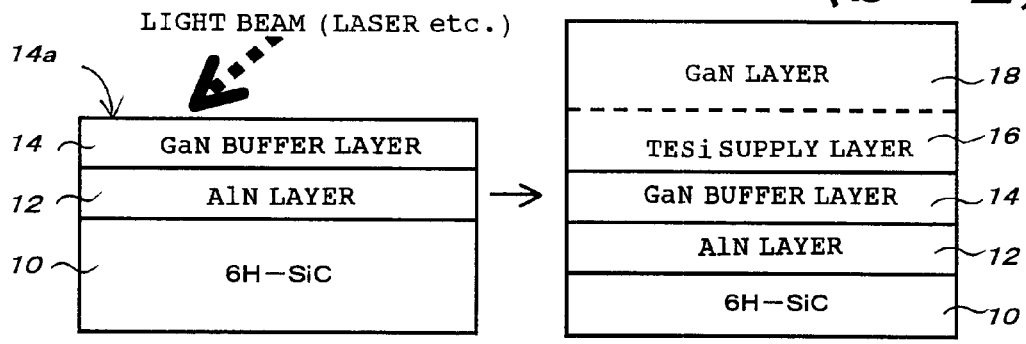
FIG. 11(c-1) FIG. 11(c-2)
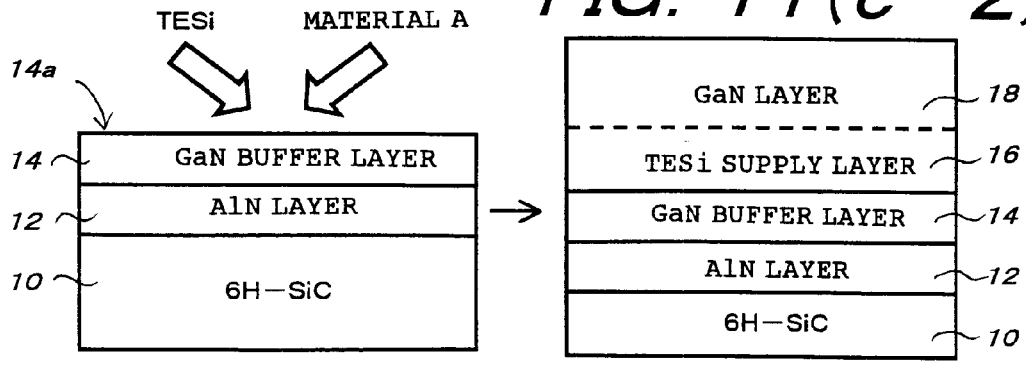

FIG. 12

| (a) | THIN FILM PREPARING TECHNOLOGY | MOCVD, MBE, CBE, HVPE, LPE, GSMBE, MOMBE CVD, SPUTTERING, LPE, VAPOR DEPOSITION PROCESS etc. |
|---|---|---|
| (b) | SUBSTRATE | $ZnO/Al_2O_3$ SUBSTRATE, Ge SUBSTRATE, SPINEL SUBSTRATE, 6H-SiC SUBSTRATE, 4H-SiC SUBSTRATE, SiC/Si SUBSTRATE, Si SUBSTRATE, SAPPHIRE ($Al_2O_3$) SUBSTRATE, GaAs SUBSTRATE, InAs SUBSTRATE, GaP SUBSTRATE, InP SUBSTRATE etc. |
| (c) | STRUCTURAL DEFECT SUPPRESSING MATERIAL | ·(THE GROUP I) H     ·(THE GROUP V)N, P, As, Sb<br>·(THE GROUP II)Be, Mg     ·(THE GROUP VI)O, S, Se, Te<br>·(THE GROUP III)Al, Ga, In<br>·(THE GROUP IV)C, Si, Ge, Sn |
| (d) | SEMICONDUCTOR HAVING REDUCED STRUCTURAL DEFECTS | ·SEMICONDUCTOR OF THE GROUP IV<br>C (DIAMOND), Si (SILICON), Ge (GERMANIUM), SiC, SiGe, SiCGe<br><br>·BINARY SYSTEM SEMICONDUCTOR OF THE GROUP III-V<br>BN, AlN, GaN, InN, BP, AlP, GaP, InP, BAs, AlAs, GaAs, InAs<br>·TERNARY SYSTEM MIXED CRYSTAL SEMICONDUCTOR OF THE GROUP III-V<br>BAlN, BGaN, BInN, AlGaN, AlInN, GaInN, BAlP, BGaP, BInP, AlGaP, AlInP, GaInP, BAlAs, BGaAs, BInAs, AlGaAs, AlInAs, GaInAs, BNP, BNAs, BPAs, AlNP, AlNAs, AlPAs, GaNP, GaNAs, GaPAs, InNP, InNAs, InPAs<br>·QUATERNARY SYSTEM MIXED CRYSTAL SEMICONDUCTOR OF THE GROUP III-V<br>BAlGaN, BAlInN, BGaInN, AlGaInN, BAlGaP, BAlInP, BGaInP, AlGaInP, BAlGaAs, BAlInAs, BGaInAs, AlGaInAs, BAlNP, BGaNP, BInNP, AlGaNP, AlInNP, GaInNP, BAlNAs, BGaNAs, BInNAs, AlGaNAs, AlInNAs, GaInNAs, BAlPAs, BGaPAs, BInPAs, AlGaPAs, AlInPAs, GaInPAs, BNPAs, AlNPAs, GaNPAs, InNPAs<br><br>·SEMICONDUCTOR OF THE GROUP II-V<br>ZnO, ZnS, ZnSe, ZnTe, CdO, CdS, CdSe, CdTe, ZnCdO, ZnCdS, ZnCdSe, ZnCdTe, ZnOS, ZnOSe, ZnOTe, ZnSSe, ZnSTe, ZnSeTe, CdOS, CdOSe, CdOTe, CdSSe, CdSTe, CdSeTe, ZnCdOS, ZnCdOSe, ZnCdOTe, ZnCdSSe, ZnCdSTe, ZnCdSeTe, ZnOSSe, ZnOSTe, ZnOSeTe, ZnSSeTe, CdOSSe, CdOSTe, CdOSeTe, CdSSeTe |

FIG. 13

| (a) | IN CASE OF FORMING AlN THIN FILM ON 6H-SiC (0001) SUBSTRATE | TEMPERATURE OF CRYSTAL GROWTH SUBSTRATE: 800°C<br>PRESSURE IN CRYSTAL GROWTH EQUIPMENT: $3 \times 10^{-5}$ Torr<br>RAW MATERIAL: SOLID Al (KNUDSEN CELL TEMPERATURE 1100°C)<br>$NH_3$ GAS (2 SCCM)<br>FILM THICKNESS: ~2nm |
|---|---|---|
| (b) | IN CASE OF FORMING GaN LAYER ON AlN THIN FILM | TEMPERATURE OF CRYSTAL GROWTH SUBSTRATE: 700°C<br>PRESSURE IN CRYSTAL GROWTH EQUIPMENT: $3 \times 10^{-5}$ Torr<br>RAW MATERIAL: SOLID Ga (KNUDSEN CELL TEMPERATURE 900°C)<br>$NH_3$ GAS (2 SCCM)<br>FILM THICKNESS: ~0.5 $\mu$m |
| (c) | IN CASE OF FORMING Si ON GaN LAYER | TEMPERATURE OF CRYSTAL GROWTH SUBSTRATE: 700°C<br>PRESSURE IN CRYSTAL GROWTH EQUIPMENT: $1 \times 10^{-7}$ Torr<br>RAW MATERIAL: SOLID Si (KNUDSEN CELL TEMPERATURE 1100°C)<br>FILM THICKNESS: ~0.3nm |
| (d) | IN CASE OF FORMING GaN LAYER ON GaN LAYER WHEREIN Si WAS ADSORBED | TEMPERATURE OF CRYSTAL GROWTH SUBSTRATE: 700°C<br>PRESSURE IN CRYSTAL GROWTH EQUIPMENT: $3 \times 10^{-5}$ Torr<br>RAW MATERIAL: SOLID Ga (KNUDSEN CELL TEMPERATURE 900°C)<br>$NH_3$ GAS (2 SCCM)<br>FILM THICKNESS: 0.5 $\mu$m |

FIG. 14

| | |
|---|---|
| (a) RAW MATERIAL SUPPLIED FOR FORMING SEMICONDUCTOR LAYER AND SEMICONDUCTOR FORMED | • GaN LAYER PREPARED FROM SOLID GALLIUM (Ga), TRIMETHYLGALLIUM (TMG), OR TRIETHYLGALLIUM (TEG) AND NITROGEN RADICAL, AMMONIA ($NH_3$), MONOMETHYLHYDRAZINE (MMHy), OR DIMETHYLHYDRAZINE (DMHy)<br>• AlGaN LAYER PREPARED FROM SOLID GALLIUM (Ga), TRIMETHYLGALLIUM (TMG), OR TRIETHYLGALLIUM (TEG); SOLID ALUMINUM (Al), TRIMETHYLALUMINUM (TMA), TRIETHYLALUMINUM (TEA), TRIMETHYLAMINEALUM (TMAAl), DIMETHYLETHYLAMINEALUM (DMEAAl), OR TRIISOBUTYLALUMINUM (TIBAl) AND NITROGEN RADICAL, AMMONIA ($NH_3$), MONOMETHYLHYDRAZINE (MMHy), OR DIMETHYLHYDRAZINE (DMHy)<br>• AlN LAYER PREPARED FROM SOLID ALUMINUM (Al), TRIMETHYLALUMINUM (TMA), TRIETHYLALUMINUM (TEA), TRIMETHYLAMINEALUM (TMAAl), DIMETHYLETHYLAMINEALUM (DMEAAl), OR TRIISOBUTYLALUMINUM (TIBAl) AND NITROGEN RADICAL, AMMONIA ($NH_3$), MONOMETHYLHYDRAZINE (MMHy), OR DIMETHYLHYDRAZINE (DMHy) |
| (b) MATERIAL USED FOR SUPPLYING Si AS STRUCTURAL DEFECT SUPPRESSING MATERIAL | SOLID SILICON (Si), SILANE ($SiH_4$), DISILANE ($Si_2H_6$), METHYLSILANE ($CH_3SiH_3$), DIMETHYLSILANE (($CH_3$)$_2SiH_2$), DIETHYLSILANE (($C_2H_5$)$_2SiH_2$), TRIMETHYLSILANE (($CH_3$)$_3SiH$), TRIETHYLSILANE (($C_2H_5$)$_3SiH$), TETRAMETHYLSILANE (TMSi) |

METHOD FOR THE FORMATION OF SEMICONDUCTOR LAYER

BACKGROUND OF THE INVENTION

1. Field of the Invention

The present invention relates to a method for the formation of a semiconductor layer (or semiconductor layers), and more particularly to a method for the formation of a semiconductor layer (layers) suitable for applying in case of forming an epitaxial semiconductor layer (or layers) of, for example, a GaN (gallium nitride) or the like thin, thick or the like film(s) on a substrate or the like made of a variety of materials.

2. Description of the Related Art

In recent years, attention is being given to GaN being an nitride semiconductor of the groups III–V as a light-emitting device material in a short wavelength region such as blue wavelength region to ultraviolet wavelength region, and in this connection, blue light emitting diode (LED) prepared from a GaN system thin film material has been realized, besides developments for blue laser prepared from such GaN system thin film material are proceeding.

As such GaN system thin films, not only GaN, but also, for example, a light-emitting device material prepared from InGaN and the like are known.

In order to improve efficiency in light emission or to realize blue laser prepared from a GaN system thin film material, it has been considered to be important that structural defects, for example, mis fit dislocations, dislocations such as threading dislocations derived from misfit dislocations, grain boundaries and the like existing in a GaN system thin film are favorably controlled.

Meanwhile, a defect density (the number of structural defects per unit area) of a GaN thin film formed on sapphire ($Al_2O_3$) which has been widely used as a substrate indicates an extremely high value.

Such a high value of the defect density in GaN system thin film is principally due to lattice mismatch of a GaN system thin film with a substrate material ($Al_2O_3$) as well as a difference in thermal expansion coefficient between them. In this respect, a high value of defect density in a GaN system thin film has been considered to be an unavoidable problem in view of an actual status where no substrate which is appropriately used as a GaN substrate and which is in good lattice match with a GaN system thin film exists.

For the sake of improving a high defect density in a GaN thin film, as shown in FIG. 1 illustrating schematically a thin film structure, such a manner that, for example, a 6H—SiC (0001) substrate being a type of SiC substrate is used, an AlN thin film is formed thereon (in a thickness of, for example, 10 nm or thicker), and a GaN system thin film is further formed thereon (in a thickness of, for example, 1.5 $\mu$m) has been applied heretofore.

Namely, since an AlN thin film has 1% of a rate of lattice mismatch with an SiC substrate, and on one hand, it exhibits a rate of lattice mismatch of 2.5% with a GaN thin film, such AlN thin film has been used as a buffer layer between the SiC substrate and the GaN system thin film.

In the thin film structure shown in FIG. 1 wherein GaN having 1.5 $\mu$m thickness is formed on the AlN thin film having a thickness of 10 nm or thicker, although a dislocation density of $10^9$ cm$^{-2}$ order was obtained as to threading dislocation in structural defects, it has been further desired to reduce remarkably dislocation density.

In view of such request, for instance, a manner of ELO (Epitaxial Lateral Overgrowth) process shown in FIGS. 2(a) and 2(b) has been lately proposed.

In the ELO process, first, crystal growth of GaN is made on a substrate 200 through a buffer layer 202 to form a first GaN layer 204 as a result of the crystal growth of GaN, and then, a mask 206 is formed on the first GaN layer 204 with the use of a predetermined mask pattern (see FIG. 2(a)).

Thereafter, further crystal growth of GaN is made on the first GaN layer 204 on which has been formed the mask 206 to form a second GaN layer 208, whereby it is intended to reduce a dislocation density of threading dislocations in the second GaN layer 208 (see FIG. 2(b)).

According to the above described ELO process, threading dislocations appear in the first GaN layer 204 at a dislocation density of 10 to $10^{10}$ cm$^{-2}$ order, while GaN crystal grown from the first GaN layer 204 which has not been covered by the mask 206 comes to grow laterally (directions indicated by the arrows in FIG. 2(b)) on the mask 206, so that a dislocation density of threading dislocations in the second GaN layer 208 was reduced to $10^7$ cm$^{-2}$ order.

In the above described ELO process, however, it is required to form the mask 206 on the first GaN layer 204 with the use of a predetermined mask pattern (see FIG. 2(a)). Accordingly, there have been such problems that a variety of processes of operation such as etching are required, whereby working hours extend over a long period of time as well as that its manufacturing cost and the like increase, so that the resulting products become expensive.

Moreover, there has been such a further problem that according to ELO process, threading dislocations appear in the second GaN layer 208 within boundary portions where GaN crystals each grown laterally by the use of the mask 206 fuse with each other (portions indicated by dotted lines in FIG. 2(b)), so that when it is arranged in such that the second GaN layer 208 containing the boundary portions is not used for a device such as blue LED, a region of a GaN system thin film which can be used for a device and the like is restricted.

OBJECTS AND SUMMARY OF THE INVENTION

The present invention has been made in view of various problems involved in the prior art as described above, and an object of the invention is to provide a method for the formation of a semiconductor layer (layers) by which a defect density of structural defects, particularly a dislocation density of threading dislocations in the resulting semiconductor layer(s) can be remarkably reduced, so that hours of work can be shortened as well as a manufacturing cost can be reduced without requiring any complicated process in case of forming a semiconductor layer (layers) of, for example, a GaN (gallium nitride) or the like thin, thick or the like film(s) on a substrate or the like made of a variety of materials.

In order to achieve the above described objects, in the present invention, a method for the formation of a semiconductor layer for forming the semiconductor layer comprises supplying a structural defect suppressing material for suppressing structural defects in the semiconductor layer.

Therefore, according to the present invention, since a structural defect suppressing material for suppressing structural defects in a semiconductor is supplied, such structural defect suppressing material is adsorbed or applied at a position where a structural defect, and particularly threading dislocation appears on a surface of a material layer on which is to be formed the semiconductor layer, so that structural defects, particularly threading dislocations in the semiconductor layer are suppressed, whereby a dislocation density can be significantly reduced.

Furthermore, in the present invention, a method for the formation of a semiconductor layer for forming the semiconductor layer comprises supplying a structural defect suppressing material for suppressing structural defects in the semiconductor layer onto a surface of the layer of a material from which the semiconductor layer is to be formed.

Therefore, according to the invention, since a structural defect suppressing material for suppressing structural defects in a semiconductor is supplied onto a surface of the layer of a material from which the semiconductor layer is to be formed, the structural defect suppressing material is adsorbed or applied at a position where a structural defect, and particularly threading dislocation appears on a surface of the layer of a material on which is to be formed the semiconductor layer, so that structural defects, particularly threading dislocations in the semiconductor layer are suppressed, whereby a dislocation density can be significantly reduced.

Moreover, in the present invention, a method for the formation of a semiconductor layer for forming the semiconductor layer comprises supplying simultaneously a structural defect suppressing material for suppressing structural defects in the semiconductor layer with a material from which the semiconductor layer is to be formed in case of forming the semiconductor layer.

Therefore, according to the invention, since a structural defect suppressing material for suppressing structural defects in a semiconductor is supplied simultaneously with a material from which the semiconductor layer is to be formed, the structural defect suppressing material is adsorbed or applied at a position where a structural defect, and particularly threading dislocation appears on a surface of the layer of a material on which is to be formed the semiconductor layer, so that structural defects, particularly threading dislocations in the semiconductor layer are suppressed, whereby a dislocation density can be significantly reduced.

Furthermore, in the present invention, a method for the formation of a semiconductor layer for forming the semiconductor layer comprises a first step for forming a buffer layer on a substrate; a second step for supplying a predetermined amount of a structural defect suppressing material for suppressing structural defects in the semiconductor layer to be formed on a surface of the buffer layer formed in the first step; a third step for forming the semiconductor layer on a surface of the buffer layer in which said structural defect suppressing material has been supplied onto the semiconductor layer to be formed in the second step; and a film thickness of the semiconductor layer in the third step being made to be 1 nm or thicker.

Therefore, according to the invention, a buffer layer is formed on a substrate in the first step, a predetermined amount of a structural defect suppressing material for suppressing structural defects in the semiconductor layer to be formed is supplied on a surface of the buffer layer in the second step, and the semiconductor layer is formed on a surface of the buffer layer onto which has been supplied the structural defect suppressing material in the third step in a film thickness of 1 nm or thicker, so that structural defects, particularly a density of threading dislocations can be significantly reduced in semiconductor layer formed by the structural defect suppressing material which has been supplied on the buffer layer with a predetermined amount so as to have a film thickness of 1 nm or thicker, while a number of structural defects, particularly threading dislocations appear in a buffer layer formed on a substrate.

The method for the formation of a semiconductor layer described in the immediately above paragraph may be arranged to further comprises a fourth step for supplying a predetermined amount of a structural defect suppressing material for suppressing structural defects in the semiconductor layer to be formed onto a surface of the semiconductor layer formed in the third step; a fifth step for forming the semiconductor layer on a surface of the semiconductor layer in which the structural defect suppressing material has been supplied onto the semiconductor layer to be formed in the fourth step; and implementing one or more times of the fourth step and the fifth step after finishing the third step.

As a result of the above modification, a predetermined amount of a structural defect suppressing material for suppressing structural defects in the semiconductor layer to be formed in the fourth step is supplied onto a surface of the semiconductor layer formed in the third step, a semiconductor layer is formed on a surface of the semiconductor layer onto which has been supplied the structural defect suppressing material in the fifth step, and one or more times of the fourth step and the fifth step are implemented after finishing the third step, so that a plurality of semiconductor layers can be laminated.

Moreover, the method for the formation of a semiconductor layer described in the above paragraph may be arranged in such that at least any of laser beam, electron beam, radical beam, ion beam, or atomic hydrogen is applied in at least either of the second step and the fourth step.

As a result of the above modification, surface diffusion in a surface onto which has been supplied a structural defect suppressing material is promoted, whereby the structural defect suppressing material is easily adsorbed or applied at positions on the surface where structural defects, and particularly threading dislocations appear, so that reforming of the surface can be more promoted in atomic level.

Furthermore, the method for the formation of a semiconductor layer described in the above paragraph may be arranged in such that a predetermined amount of plural types of structural defect suppressing materials for suppressing structural defects in the semiconductor layer to be formed are supplied in at least either of the second step and the fourth step.

As a result of the above modification, since a predetermined amount of plural types of structural defect suppressing materials are supplied in either of the above described second step and the fourth step, surface diffusion in a surface onto which have been supplied structural defect suppressing materials is promoted, whereby the structural defect suppressing materials are easily adsorbed or applied at positions where structural defects, and particularly threading dislocations appear on the surface, so that reforming of the surface can be more promoted in atomic level.

Moreover, a method for the formation of a semiconductor layer for forming the semiconductor layer comprises a first step for forming a buffer layer on a substrate; a second step for starting a supply of a material for forming the semiconductor layer to be formed as well as a supply of a structural defect suppressing material for suppressing structural defects in the semiconductor layer to be formed onto a surface of the buffer layer formed in the first step at the same timing, besides finishing the supply of a structural defect suppressing material for suppressing structural defects in the semiconductor layer to be formed at a timing prior to that of the supply of a material for forming the semiconductor layer to be formed; and a film thickness of the semiconductor layer in the second step being made to be 1 nm or thicker.

Therefore, according to the present invention, a buffer layer is formed on a substrate in the first step; a supply of a material for forming the semiconductor layer to be formed as well as a supply of a structural defect suppressing material for suppressing structural defects in the semiconductor layer to be formed onto a surface of the buffer layer are started at the same timing, besides the supply of a structural defect suppressing material for suppressing structural defects in the semiconductor layer to be formed is finished at a timing prior to that of the supply of a material for forming the semiconductor layer to be formed in the second step; and the semiconductor layer is formed in a film thickness of 1 nm or thicker, so that structural defects, particularly a density of threading dislocations can be significantly reduced in semiconductor layer formed by the structural defect suppressing material which has been supplied on the buffer layer with a predetermined amount so as to have a film thickness of 1 nm or thicker, while a number of structural defects, particularly threading dislocations appear in a buffer layer formed on a substrate.

A method for the formation of a semiconductor layer described in the immediately above paragraph may be arranged to further comprises a third step for starting a supply of a material for forming a semiconductor layer to be formed as well as a supply of a structural defect suppressing material for suppressing structural defects in the semiconductor layer to be formed onto a surface of the above described semiconductor layer formed in the second step at the same timing, besides finishing the supply of a structural defect suppressing material for suppressing structural defects in the semiconductor layer to be formed at a timing prior to that of the supply of a material for forming the semiconductor layer to be formed; and implementing at least one time of the third step after finishing the second step.

As a result of the above modification, a supply of a material for forming a semiconductor layer to be formed as well as a supply of a structural defect suppressing material for suppressing structural defects in the semiconductor layer to be formed onto a surface of the above described semiconductor layer formed in the second step are started at the same timing, besides the supply of a structural defect suppressing material for suppressing structural defects in the semiconductor layer to be formed is finished at a timing prior to that of the supply of a material for forming the semiconductor layer to be formed in the third step; and at least one time of the third step is implemented after finishing the second step, whereby a plurality of semiconductor layers can be laminated.

Furthermore, a method for the formation of a semiconductor layer described in the above paragraph may be arranged in such that at least any of laser beam, electron beam, radical beam, ion beam, or atomic hydrogen is applied in at least either of the second step and the third step.

As a result of the above modification, surface diffusion in a surface onto which has been supplied a structural defect suppressing material is promoted, whereby the structural defect suppressing material is easily adsorbed or applied at a position on the surface where structural defects, and particularly threading dislocations appear, so that reforming of the surface can be more promoted in atomic level.

Still further, a method for the formation of a semiconductor layer described in the above paragraph may be arranged in such that a predetermined amount of plural types of structural defect suppressing materials for suppressing structural defects in the semiconductor layer to be formed are supplied in at least either of the second step and the third step.

As a result of the above described modification, since a predetermined amount of plural types of structural defect suppressing materials for suppressing structural defects in the semiconductor layer to be formed are supplied in at least either of the second step and the third step, surface diffusion in a surface onto which has been supplied a structural defect suppressing material is promoted, whereby the structural defect suppressing material is easily adsorbed or applied at a position on the surface where structural defects, and particularly threading dislocations appear, so that reforming of the surface can be more promoted in atomic level.

Moreover, in a method f or the formation of a semiconductor layer in the above paragraphs, the above described substrate may be a silicon carbide substrate (6H—SiC substrate, 4H—SiC substrate), a laminated substrate of silicon carbide and silicon (SiC/Si substrate), a silicon substrate (Si substrate), a sapphire substrate ($Al_2O_3$ substrate), a laminated substrate of zinc oxide and sapphire ($ZnO/Al_2O_3$ substrate), a germanium substrate (Ge substrate), a gallium arsenide substrate (GaAs substrate), an indium arsenide substrate (InAs substrate), a gallium phosphide substrate (GaP substrate), an indium phosphide substrate (InP substrate), or a spinel substrate ($MgAl_2O_3$, $LiGaO_2$); the above described structural defect suppressing material may be H (hydrogen) of the group I-A; Be (beryllium), or Mg (magnesium) of the group II-A; Al (aluminum), Ga (gallium), or In (indium) of the group III-B; C (carbon), Si (silicon), Ge (germanium), or Sn (tin) of the group IV-B; N (nitrogen), P (phosphorus), As (arsenic), or Sb (antimony); or O (oxygen), S (sulfur), Se (selenium), or Te (tellurium) of the group V-B in periodic table; and the semiconductor layer may be a layer of a semiconductor C (diamond), Si (silicon), Ge (germanium), SiC, SiGe, or SiCGe of the group IV; that of a binary system semiconductor of BN, AlN, GaN, InN, BP, AlP, GaP, InP, BAs, AlAs, GaAs, or InAs of the groups III–V; that of a ternary system mixed crystal semiconductor BAlN, BGaN, BInN, AlGaN, AlInN, GaInN, BAlP, BGaP, BInP, AlGaP, AlInP, GaInP, BAlAs, BGaAs, BInAs, AlGaAs, AlInAs, GaInAs, BNP, BNAs, BPAS, AlNP, AlNAs, AlPAs, GaNP, GaNAs, GaPAs, InNP, InNAs, or InPAs of the groups III–V; that of a quaternary system mixed crystal semiconductor BAlGaN, BAlInN, BGaInN, AlGaInN, BAlGaP, BAlInP, BGaInP, AlGaInP, BAlGaAs, BAlInAs, BGaInAs, AlGaInAs, BAlNP, BGaNP, BInNP, AlGaNP, AlInNP, GaInNP, BAlNAs, BGaNAs, BInNAs, AlGaNAs, AlInNAs, GaInNAs, BAlPAs, BGaPAs, BInPAs, AlGaPAs, AlInPAs, GaInPAs, BNPAs, AlNPAs, GaNPAs, or InNPAs of the groups III–V; or that of a semiconductor of ZnO, ZnS, ZnSe, ZnTe, CdO, CdS, CdSe, CdTe, ZnCdO, ZnCdS, ZnCdSe, ZnCdTe, ZnOS, ZnOSe, ZnOTe, ZnSSe, ZnSTe, ZnSeTe, CdOS, CdOSe, CdOTe, CdSSe, CdSTe, CdSeTe, ZnCdOS, ZnCdOSe, ZnCdOTe, ZnCdSSe, ZnCdSTe, ZnCdSeTe, ZnOSSe, ZnOSTe, ZnOSeTe, ZnSSeTe, CdOSSe, CdOSTe, CdOSeTe, or CdSSeTe of the groups II—VI in periodic table.

Furthermore, according to the present invention, a method for the formation of semiconductor layers on a substrate through a buffer layer comprises applying an MOCVD (Metalorganic Chemical Vapor Deposition), an MBE (Molecular Beam Epitaxy), a CBE (Chemical Beam Epitaxy), an HAVPE (Halide Vapor Phase Epitaxy), a GSMBE (Gas-Source Molecular Beam Epitaxy), an MOMBE (Metalorganic MBE), an LPE (Liquid Phase Epitaxy), a CVD (Chemical Vapor Deposition), a sputtering, or a vacuum deposition process; a first step for supplying solid gallium (Ga), trimethylgallium (TMG), or triethylgallium (TEG), solid aluminum (Al), trimethylaluminum (TMA), triethylaluminum (TEA), trimethylaminealum (TMAAl), dimethylethylaminealum (DMEAAl), or triisobutylaluminum (TIBAl) and nitrogen radical, ammonia ($NH_3$), monomethylhydrazine (MMHy), ordimethylhydrazine (DMHY) on a surface of a SiC substrate or an $Al_2O_3$ substrate to form a GaN layer, an AlN layer, or an AlGaN layer as a buffer layer; a second step for supplying Si being a structural defect suppressing material used for a GaN layer, an AlN layer, or an AlGaN layer as a semiconductor layer to be formed in a film on a surface of the GaN layer, the AlN layer, or AlGaN layer as the buffer layer which has been formed in the first step with the use of solid silicon (Si), silane ($SiH_4$), disilane ($Si_2H_6$), methylsilane ($CH_3SiH_3$), dimethylsilane (($CH_3)_2SiH_2$), diethylsilane (($C_2H_5)_2SiH_2$), trimethylsilane (($CH_3)_3SiH$), triethylsilane (($C_2H_5)_3SiH$), tetramethylsilane (TMSi), or tetraethylsilane (TESi); and a third step for supplying solid gallium (Ga), trimethylgallium (TMG), or triethylgallium (TEG), solid aluminum (Al), trimethylaluminum (TMA), triethylaluminum (TEA), trimethylaminealum (TMAAl), dimethylethylaminealum (DMEAAl), or triisobutylaluminum (TIBAl) and nitrogen radical, ammonia ($NH_3$), monomethylhydrazine (MMHy), or dimethylhydrazine (DMHy) on a surface of a GaN layer, an AlN layer, or an AlGaN layer as the buffer layer to which has been supplied the Si in the second step to form a GaN layer, an AlN layer, or an AlGaN layer as the semiconductor layer in a thickness of 1 nm or thicker.

Therefore, according to the present invention, in a method for the formation of semiconductor layers on a substrate through a buffer layer, an MOCVD (Metalorganic Chemical Vapor Deposition), an MBE (Molecular Beam Epitaxy), a CBE (Chemical Beam Epitaxy), an HAVPE (Halide Vapor Phase Epitaxy), a GSMBE (Gas-Source Molecular Beam Epitaxy), an MOMBE (Metalorganic MBE), an LPE (Liquid Phase Epitaxy), a CVD (Chemical Vapor Deposition), a sputtering, or a vacuum deposition process is applied; solid gallium (Ga), trimethylgallium (TMG), or triethylgallium (TEG), solid aluminum (Al), trimethylaluminum (TMA), triethylaluminum (TEA), trimethylaminealum (TMAAl), dimethylethylaminealum (DMEAAl), or triisobutylaluminum (TIBAl) and nitrogen radical, ammonia ($NH_3$), monomethylhydrazine (MMHy), or dimethylhydrazine (DMHY) are supplied on a surface of a SiC substrate or an $Al_2O_3$ substrate to form a GaN layer, an AlN layer, or an AlGaN layer as a buffer layer in the first step; Si being a structural defect suppressing material used for a GaN layer, an AlN layer, or an AlGaN layer as a semiconductor layer to be formed in a film is supplied on a surface of the GaN layer, the AlN layer, or AlGaN layer as the buffer layer with the use of solid silicon (Si), silane ($SiH_4$), disilane ($Si_2H_6$), methylsilane ($CH_3SiH_3$), dimethylsilane (($CH_3)_2SiH_2$), diethylsilane (($C_2H_5)_2SiH_2$), trimethylsilane (($CH_3)_3SiH$), triethylsilane (($C_2H_5)_3SiH$), tetramethylsilane (TMSi), or tetraethylsilane (TESi) in the second step; and a third step for supplying solid gallium (Ga), trimethylgallium (TMG), or triethylgallium (TEG), solid aluminum (Al), trimethylaluminum (TMA), triethylaluminum (TEA), trimethylaminealum (TMAAl), dimethylethylaminealum (DMEAAl), or triisobutylaluminum (TIBAl) and nitrogen radical, ammonia ($NH_3$), monomethylhydrazine (MMHy), or dimethylhydrazine (DMHy) are supplied on a surface of a GaN layer, an AlN layer, or an AlGaN layer as the above described buffer layer to which has been supplied the Si to form a GaN layer, an AlN layer, or an AlGaN layer as the semiconductor layer in a thickness of 1 nm or thicker in the third step. As a result, Si is adsorbed on the surface of a GaN layer, an AlN layer, or an AlGaN layer, whereby the surface of the GaN layer, the AlN layer, or the AlGaN layer is reformed in atomic level, and thereafter another GaN layer, AlN layer, or AlGaN layer is formed as a semiconductor layer, so that a defect density of structural defects, particularly a dislocation density of threading dislocations in the GaN layer, the AlN layer, or the AlGaN layer being the semiconductor layer can be significantly reduced.

In addition, since Si supplied as a structural defect suppressing material is a metal used as an n-type impurity material for a GaN layer, an AlN layer, or an AlGaN layer, it does not affect adversely quality of the resulting semiconductor layer in case of forming the GaN layer, the AlN layer, or the AlGaN layer as an n-type semiconductor layer, and thus, such Si can be easily supplied.

Moreover, according to the present invention, a method for the formation of a semiconductor layer in which a GaN layer or an AlGaN layer is formed on an Sic substrate or an $Al_2O_3$ substrate by means of MOCVD (Metalorganic Chemical Vapor Deposition) equipment comprises a first step for either supplying trimethylgallium (TMG) or triethylgallium (TEG) and ammonia ($NH_3$) onto a surface of the SiC substrate or the $Al_2O_3$ substrate to form a GaN layer as a buffer layer, or supplying trimethylgallium (TMG) or triethylgallium (TEG) and trimethylaluminum (TMA) or triethylaluminum (TEA) and ammonia ($NH_3$) thereon to form an AlGaN layer as a buffer layer; a second step for supplying Si being an n-type impurity material used for a GaN layer or an AlGaN layer on a surface of the GaN layer or the AlGaN layer being the buffer layer formed in the first step with the use of silane ($SiH_4$), disilane ($Si_2H_6$), or tetraethylsilane (TESi) in one monolayer or less; and a third step for either supplying trimethylgallium (TMG) or triethylgallium (TEG) and ammonia ($NH_3$) on a surface of the GaN layer or the AlGaN layer being the buffer layer to which has been supplied the silane ($SiH_4$), disilane ($Si_2H_6$), or tetraethylsilane (TESi) in the second step to form a GaN layer in a thickness of 1 nm or thicker, or supplying trimethylgallium (TMG) or triethylgallium (TEG) and trimethylaluminum (TMA) or triethylaluminum (TEA) and ammonia ($NH_3$) to form a AlGaN layer in a thickness of 1 nm or thicker.

Therefore, according to the present invention, in a method for the formation of a semiconductor layer in which a GaN layer or an AlGaN layer is formed on an SiC substrate or an $Al_2O_3$ substrate by means of MOCVD (Metalorganic Chemical Vapor Deposition) equipment, either trimethylgallium (TMG) or triethylgallium (TEG) and ammonia ($NH_3$) are supplied onto a surface of the SiC substrate or the $Al_2O_3$ substrate to form a GaN layer as a buffer layer, or trimethylgallium (TMG) or triethylgallium (TEG) and trimethylaluminum (TMA) or triethylaluminum (TEA) and ammonia ($NH_3$) are supplied thereon to form an AlGaN layer as a buffer layer in the first step; Si being an n-type impurity material used for a GaN layer or an AlGaN layer is supplied on a surface of the GaN layer or the AlGaN layer being the buffer layer with the use of silane ($SiH_4$), disilane ($Si_2H_6$), or tetraethylsilane (TESi) in one monolayer or less in the second step; and either trimethylgallium (TMG) or triethylgallium (TEG) and ammonia ($NH_3$) are supplied on a surface of the GaN layer or the AlGaN layer being the buffer layer to which has been supplied the silane ($SiH_4$), disilane ($Si_2H_6$), or tetraethylsilane (TESi) to form a GaN layer in a thickness of 1 nm or thicker, or trimethylgallium (TMG) or triethylgallium (TEG) and trimethylaluminum (TMA) or triethylaluminum (TEA) and ammonia ($NH_3$) are supplied thereon to form a AlGaN layer in a thickness of 1 nm or thicker in the third step.

Hence, Si in the silane ($SiH_4$), disilane ($Si_2H_6$), or tetraethylsilane (TESi) is adsorbed on a surface of a GaN layer, or an AlGaN layer, whereby the surface of the GaN layer, or the AlGaN layer is reformed in atomic level, and thereafter another GaN layer, or AlGaN layer is formed as a semiconductor layer, so that a defect density of structural defects, particularly a dislocation density of threading dislocations in the GaN layer being a semiconductor layer can be significantly reduced.

In addition, since Si supplied as a structural defect suppressing material is a metal used as an n-type impurity material for a GaN layer, or an AlGaN layer, it does not affect adversely quality of the resulting semiconductor layer in case of forming the GaN layer, or the AlGaN layer as a semiconductor layer, and thus, such Si can be easily supplied.

BRIEF DESCRIPTION OF THE DRAWINGS

The present invention will become more fully understood from the detailed description given hereinafter and the accompanying drawings which are given by way of illustration only, and thus are not limitative of the present invention, and wherein:

FIG. 3(*d*) is an explanatory view illustrating schematically a thin film structure of the GaN thin film which has been formed on the 6H—SiC (0001) substrate in accordance with a method for the formation of a semiconductor layer of the present invention.

FIGS. 4(*a*), 4(*b*), 4(*c*), and 4(*d*) are tables each showing a treating condition in case of forming the thin film structure illustrated in FIG. 3(*d*) by the use of MOCVD system wherein FIG. 4(*a*) is a table showing a treating condition in case of forming an AlN thin film on the 6H—SiC (0001) substrate, FIG. 4(*b*) is a table showing a treating condition in case of forming a GaN buffer layer on the AlN thin film, FIG. 4(*c*) is a table showing a treating condition in case of supplying TESi onto the GaN buffer layer, and FIG. 4(*d*) is a table showing a treating condition in case of supplying trmethylgallium (TMG) and ammonia ($NH_3$).

FIG. 7(*a*) is an explanatory view illustrating schematically a state wherein a GaN thin film is formed as a semiconductor layer in accordance with a second embodiment of a method for the formation of a semiconductor layer according to the present invention, and FIG. 7(*b*) is a table indicating a treating condition in case of forming the thin film structure shown in FIG. 7(*a*) by the use of MOCVD process.

FIGS. 8(*a*-1) and 8(*a*-2) are explanatory diagrams each illustrating schematically a state in time-series order in which a GaN thin film is formed as a semiconductor layer in accordance with a third embodiment of a method for the formation of a semiconductor layer according to the present invention, and FIG. 8(*b*) is a table showing treating conditions in case of forming the thin film structures illustrated in FIGS. 8(*a*-1) and 8(*a*-2) by the use of MOCVD process.

FIGS. 9(*a*-1) and 9(*a*-2) are explanatory diagrams each illustrating schematically a state in time-series order in which a GaN thin film is formed as a semiconductor layer in accordance with a fourth embodiment of a method for the formation of a semiconductor layer according to the present invention, and FIG. 9(*b*) is a table showing treating conditions in case of forming the thin film structures illustrated in FIGS. 9(*a*-1) and 9(*a*-2) by the use of MOCVD process.

FIG. 11(*a*) is an explanatory view illustrating schematically a state wherein GaN thin films are formed as semiconductor layers in accordance with a sixth embodiment of a method for the formation of semiconductor layers according to the present invention, while FIGS. 11(*b*-1) and 11(*b*-2) are explanatory diagrams each illustrating schematically a state in time-series order in which a GaN thin film(s) is (are) formed as a semiconductor layer(s) in accordance with a seventh embodiment of a method for the formation of a semiconductor layer(s) according to the present invention as well as FIGS. 11(*c*-1) and 11(*c*-2) are explanatory diagrams each illustrating schematically a state in time-series order in which a GaN thin film(s) is (are) formed as a semiconductor layer(s) in accordance with a eighth embodiment of a method for the formation of a semiconductor layer(s) according to the present invention.

FIGS. 12(*a*), 12(*b*), and 12(*c*) are tables indicating methods for preparing thin films (*a*), substrates (*b*) and materials for suppressing structural defects (*c*) which may be applied to a method for the formation of a semiconductor layer(s) according to the present invention as well as FIG. 12(*d*) is a table indicating semiconductor layers wherein structural defects which will be formed (d) were reduced, respectively.

FIG. 13(a), 13(b), 13(c) and 13(d) are tables each showing a treating condition in case of forming a GaN thin film by the use of GSMBE process wherein FIG. 13(a) is a table indicating a treating condition in case of forming an AlN thin film on a 6H—SiC (0001) substrate, 13(b) is a table indicating a treating condition in case of forming a GaN buffer layer on the AlN thin film, FIG. 13(c) is a table indicating a treating condition in case of supplying TESi on the GaN buffer layer, and 13(d) is a table indicating a treating condition in case of trimethylgallium (TMG) and ammonia ($NH_3$).

FIG. 14(a) is a table showing raw materials supplied for forming semiconductor layers which can be used in a method for the formation of semiconductor layers according to the present invention as well as the semiconductor layers to be formed (a), and FIG. 14(b) is a table showing materials for suppressing structural defects (b).

DETAILED DESCRIPTION OF THE PREFERRED EMBODIMENTS

In the following, a first embodiment of a method for the formation of a semiconductor layer according to the present invention will be described in detail by referring to the accompanying drawings.

Figure 3A:
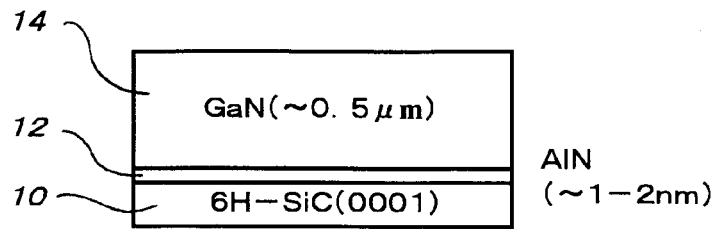
FIGS. 3(*a*), 3(*b*), 3(*c*) and 3(*d*) are explanatory views each illustrating schematically a state in time-series order in which a GaN thin film is formed on a 6H—SiC (0001) in accordance with a method for the formation of a semiconductor layer of the present invention wherein FIG. 3(*a*) is an explanatory view illustrating schematically a state in which an AlN thin film is formed on a 6H—SiC (0001) substrate, and a GaN layer is further formed on the AlN thin film, FIG. 3(*b*) is an explanatory view illustrating schematically a state in which tetraethylsilane (TESi) is supplied on the surface of the GaN layer, FIG. 3(*c*) is an explanatory view illustrating schematically a state in which Si in the TESi supplied is adsorbed on the surface of the GaN layer.
Figure 3B:
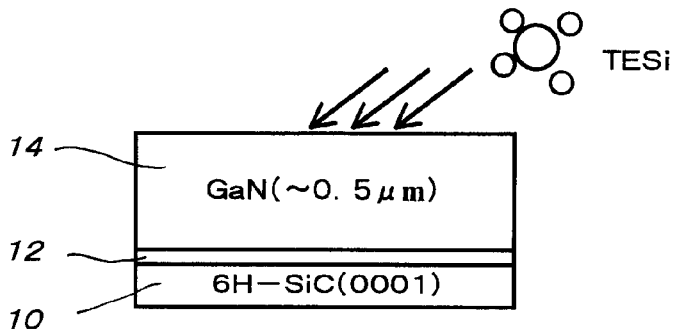
Figure 3C:
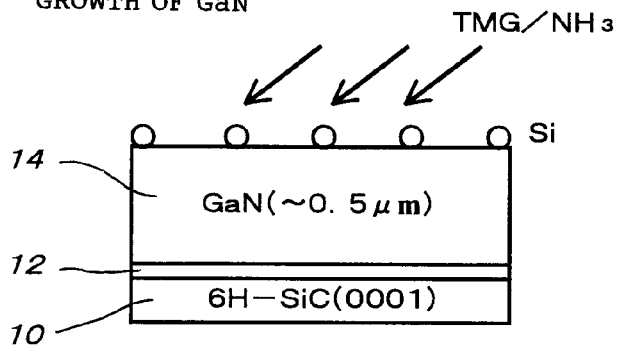
Figure 3D:
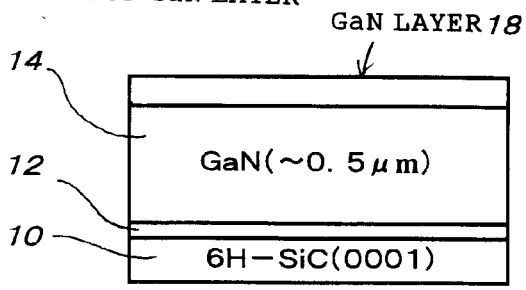

FIG. 3 illustrates schematically a state in which a GaN thin film is formed as a semiconductor layer on a 6H—SiC (0001) substrate being a type of SiC (silicon carbide) substrates in time-series order in accordance with the first embodiment of a method for the formation of a semiconductor layer according to the present invention wherein the state illustrated in FIG. 3(a) shifts successively to the state illustrated in FIG. 3(b), the state illustrated in FIG. 3(c), and the state illustrated in FIG. 3(d).

In the present embodiment, although a horizontal type pressure-reduced (76 Torr) metalorganic chemical vapor deposition (MOCVD) reactor is employed for forming a thin film structure illustrated in FIG. 3(d), it is not limited to such manner as described above, as a matter of course, but a thin film preparing technique such as sputtering process other than MOCVD process may be applied as mentioned hereinafter.

Figure 5:
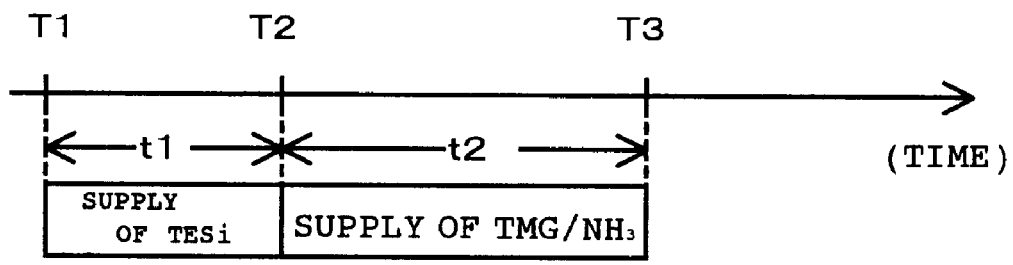
FIG. 5 is an explanatory diagram indicating timing for supplying TESi and a gas for forming a GaN thin film as a semiconductor layer in accordance with a first embodiment of a method for the formation of a semiconductor layer (layers) according to the present invention.

FIGS. 4(a) through 4(d) indicate treating conditions in case.of forming the thin film structure illustrated in FIG. 3(d) in accordance with MOCVD process, and FIG. 5 is an explanatory diagram showing a timing for supplying TESi (which is mentioned hereunder) and gases for forming a GaN thin film as a semiconductor layer in accordance with the first embodiment of a method for the formation of a semiconductor layer according to the present invention.

Figure 6:
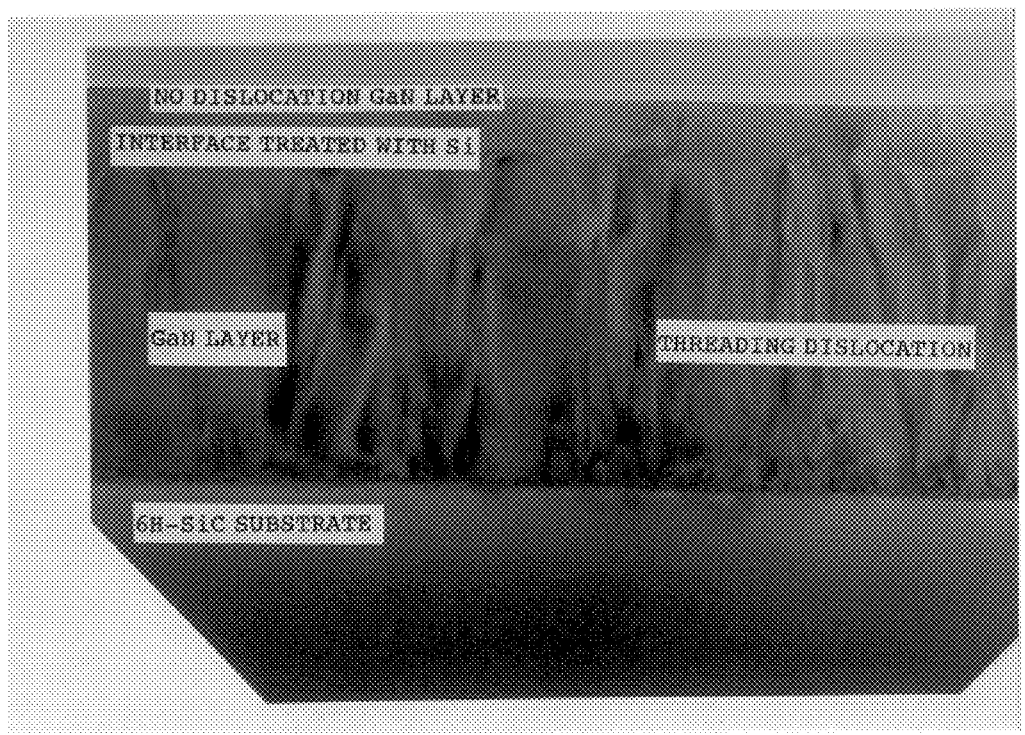
FIG. 6 is a section of an electron micrograph having the thin film structure shown in FIG. 3(*d*) in accordance with TEM.

Moreover, FIG. 6 is an electron micrograph taken by means of a transmission type electron microscope (TEM) showing a section of the thin film structure illustrated in FIG. 3(d) which is formed in accordance with the treating conditions indicated in FIGS. 4(a), 4(b), 4(c), and 4(d).

In order to make understanding of the present invention easy, an outline of a treatment in case of forming the thin film structure illustrated in FIG. 3(d) in accordance with the first embodiment of a method for the formation of a semiconductor layer according to the present invention will be described herein. First, an AlN (aluminum nitride) thin film 12 is formed as a buffer layer on a 6H—SiC (0001) substrate 10 as a substrate (see FIG. 3(a)).

Then, a GaN buffer layer 14 is formed on the AlN thin film 12 as a buffer layer, and tetraethylsilane (TESi) is supplied on a surface 14a of the GaN buffer layer 14 as an n-type impurity material (see FIG. 3 (b)).

Thereafter, trimethylgallium (TMG) and ammonia ($NH_3$) are supplied on the GaN buffer layer 14 to which has been supplied TESi to form a GaN layer 18 as a semiconductor layer.

As a result, the TESi functions to suppress structural defects, particularly growth of threading dislocations, whereby structural defects, particularly a dislocation density of the GaN layer 18 which is formed as a semiconductor layer by supplying trimethylgallium (TMG) and ammonia ($NH_3$) after the supply of TESi as a result of crystal growth of GaN could be remarkably reduced.

A treatment in case of forming the thin film structure illustrated in FIG. 3(d) in accordance with the first embodiment of a method for the formation of a semiconductor layer of the invention will be described in detail hereinafter.

First, an AlN thin film 12 being a buffer layer is formed on a 6H—SiC (0001) substrate 10 in accordance with the treating condition indicated in FIG. 4(a), and further, a GaN buffer layer 14 being a buffer layer is formed on the AlN thin film 12 in accordance with the treating condition indicated in FIG. 4(b) (see FIG. 3(a)).

The GaN buffer layer 14 is a buffer layer interposed between the AlN thin film 12 formed under the GaN buffer layer 14 and the AlN thin film 12 formed on the GaN buffer layer 14, and threading dislocations with a dislocation density in the order of $10^9$ to $10^{10}$ $cm^{-2}$ are observed in the GaN buffer layer 14 due to lattice mismatch with respect to the substrate material (6H—SiC (0001)) (see FIG. 5).

Then, TESi (a metal used as an n-type impurity material with respect to GaN) is supplied on the surface 14a of the GaN buffer layer 14 at a timing T1 (see FIG. 5) in accordance with the treating condition shown in FIG. 4(c) (FIG. 3(b)) after the GaN buffer layer 14 was formed on the AlN thin film 12 (FIG. 3(a)).

In this case, threading locations appear in the GaN buffer layer 14 as described above, and in this respect, an atomic clearance expands at a position where the threading dislocations appear on the surface 14a of the GaN buffer layer 14.

Since a magnitude of expansion in an atomic clearance at a position where the threading locations appear (hereinafter referred to as "dislocation core position") on the surface 14a of the GaN buffer layer 14 as described above is 8 fold in dislocation core structure according to literature, it may be considered that such dimension is the one wherein Si in the TESi supplied can be easily adsorbed thereat (can be combined therewith).

When TESi is supplied on the surface 14a of the GaN buffer layer 14 in such a situation, Si in the TESi supplied is adsorbed at dislocation core positions of the surface 14a of the GaN buffer layer 14 (see FIG. 3(c)), whereby the surface 14a of the GaN buffer layer 14 is reformed in atomic level.

Such reforming in atomic level of the surface 14a of the GaN buffer layer 14 is caused by Si in TESi, and when the surface 14a of the GaN buffer layer 14 is reformed in atomic level, appearance of structural defects, particularly threading dislocations in the GaN layer 18 formed on the surface 14a of the GaN buffer layer 14 are suppressed, so that a defect density, particularly a dislocation density is reduced.

In the present specification, a material such as the TESi as described above which reforms the surface of a material layer on which is to be supplied the TESi in an atomic level to suppress structural defects such as threading dislocations in another material layer to be formed on the material layer on which has been supplied the TESi, whereby a defect density such a dislocation density is reduced therein is referred to as "structural defect suppressing material".

At a timing T2 (see FIG. 5) when a predetermined period of time t1 (see FIG. 5) elapsed from a timing T1 (see FIG. 5), a supply of TESi to the surface 14a of the GaN buffer layer 14 is finished, and at the same time, a supply of trimethylgallium (TMG) and ammonia (NH$_3$) is started in accordance with the treating condition indicated in FIG. 4(d) to form a GaN layer 18 (see FIGS. 3(c) and 3(d)) through an interface which has been treated by supplying TESi onto the GaN buffer layer 14 (see FIG. 6).

Thereafter, at a timing T3 (see FIG. 5) when a predetermined period of time t2 (see FIG. 5) elapsed from the timing T2 (see FIG. 5), a supply of trimethylgallium (TMG) and ammonia (NH$_3$) is finished. As a result, threading locations were observed at a dislocation density of only $10^6$ cm$^{-2}$ order in the GaN layer 18 formed (1 nm film thickness) (see FIG. 6).

Namely, a number of (a dislocation density of $10^9$ to $10^{10}$ cm$^{-2}$ order) threading dislocations appear in the GaN buffer layer 14 being a buffer layer, while a density of threading dislocations was remarkably reduced (a dislocation density of $10^6$cm$^{-2}$ order) in the GaN layer 18 formed through the interface which has been treated by supplying TESi on the GaN buffer layer 14 (see FIG. 6).

As described above, since TESi being a structural defect suppressing material is supplied in the first embodiment of a method for the formation of a semiconductor layer according to the present invention, a surface 14a of a GaN buffer layer 14 being a buffer layer is reformed in an atomic level by means of Si in the TESi, whereby a defect density of structural defects, particularly a dislocation density of threading dislocations in a GaN layer 18 being a semiconductor layer can be significantly reduced.

Furthermore, it is sufficient for suppressing occurrence of structural defects in the first embodiment of a method for the formation of a semiconductor layer according to the present invention to carry out such extremely simple treatment that a predetermined amount of TESi being a structural defect suppressing material is supplied, so that it is not required to take a variety of complicated procedures such as etching in case of forming a mask in ELO process. Accordingly, operating time can be reduced as well as manufacturing cost can be decreased in the first embodiment of the present invention.

It is to be noted that since TESi supplied as a structural defect suppressing material is a metal which is used as an n-type impurity material with respect to GaN, the TESi does not function as a material making quality of a resulting semiconductor layer deteriorative in case of forming the GaN layer 18 as a semiconductor layer. Thus, a supply of the TESi can be easily made.

Figure 1:
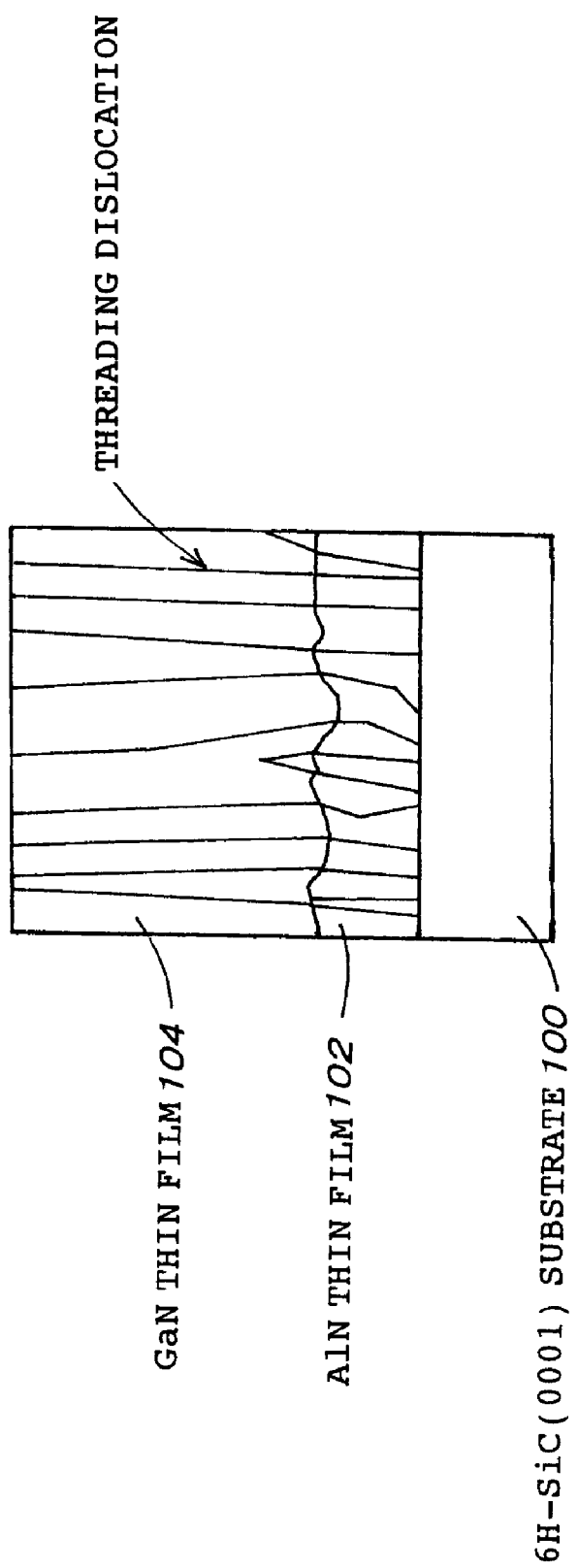
FIG. 1 is an explanatory view illustrating schematically a thin film structure of a GaN thin-film formed through an AlN thin film on a conventional 6H—SiC (0001) substrate.
Figure 2A:
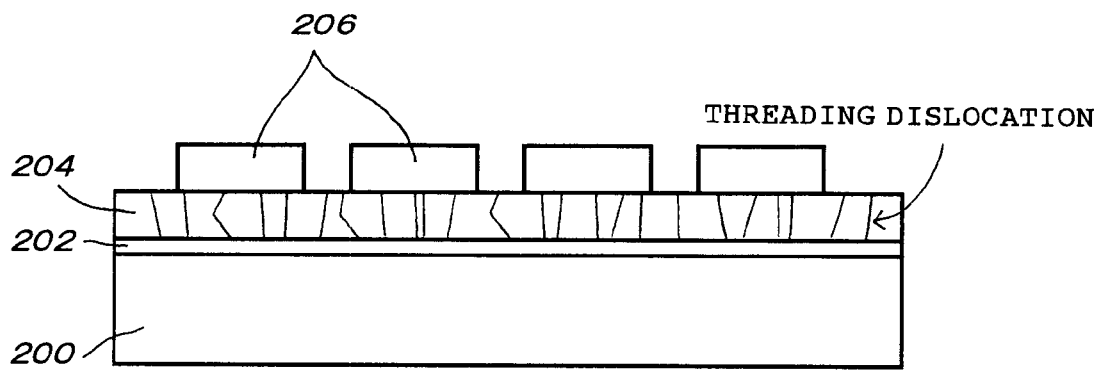
FIGS. 2(*a*) and 2(*b*) are explanatory views each illustrating schematically a state in which a GaN thin film is formed on a substrate through a buffer layer in accordance with ELO process wherein FIG. 2(*a*) is an explanatory view illustrating schematically a state wherein a mask is formed on a first GaN layer with a predetermined mask pattern, and FIG. 2(*b*) is an explanatory view illustrating schematically a state wherein a second GaN layer is further formed.
Figure 2B:
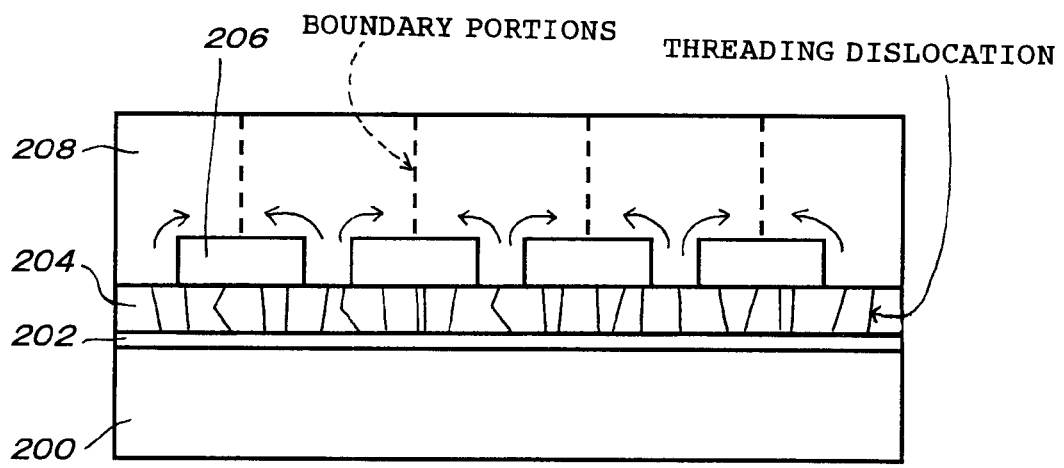

Moreover, Si in TESi being a structural defect suppressing material is adsorbed on the surface 14a of the GaN buffer layer 14 to reform the surface 14a of the GaN buffer layer 14 in an atomic level, and then, the GaN layer 18 is formed in the first embodiment of a method for the formation of a semiconductor layer according to the present invention. Therefore, no portion such as boundary portions (the portions dotted in FIG. 2(b)) where threading locations produced in ELO process appear easily exists in the GaN layer 18, so that a GaN thin film which is easily utilized in industry can be obtained, because a field of GaN thin film which can be applied to a device and the like is not restricted.

In the following, a second embodiment of a method for the formation of semiconductor layers according to the present invention will be described by referring to FIGS. 7(a) and 7(b), respectively.

FIG. 7(a) illustrates schematically a state wherein GaN thin films are formed as semiconductor layers in accordance with the second embodiment of a method for the formation of semiconductor layers of the invention, and FIG. 7(b) indicates a treating condition in case of forming the thin film structure shown in FIG. 7(a) in accordance with MOCVD process.

When the second embodiment of a method for the formation of semiconductor layers according to the present invention is compared with the first embodiment of a method for the formation of a semiconductor layer according to the present invention, only single layer of the semiconductor layer (GaN layer 18) is formed (see FIG. 3(d)) in the above described first embodiment of a method for the formation of a semiconductor layer of the invention, while a plurality of semiconductor layers are formed by laminating a plurality of layers in the second embodiment of a method for the formation of semiconductor layers of the invention.

More specifically, on the surface of a GaN layer 18 being a semiconductor layer formed as in the first embodiment of a method for the formation of a semiconductor layer of the invention, a GaN layer 20 being a semiconductor layer is further laminated.

Accordingly, since treating conditions and the like (see FIGS. 4(a) to 4(d)) in a course wherein an AlN (aluminum nitride) thin film 12 is formed as a buffer layer on a 6H—SiC (0001) substrate 10 as a substrate, then, a GaN buffer layer 14 is formed as another buffer layer on the AlN thin film 12 (see FIG. 3(a)), thereafter, TESi is supplied onto a surface 14a of the GaN buffer layer 14 (see FIG. 3(b), and a further GaN layer 18 is formed (see FIGS. 3(c) and 3(d)) are the same as those described in the explanation for operations in the aforesaid first embodiment of a method for the formation of a semiconductor layer of the invention, the detailed description therefor are omitted by quoting the corresponding description.

Namely, a defect density of structural defects, particularly a dislocation density of threading dislocations in the GaN layer 18 (see FIG. 3(d)) formed in accordance with the treating conditions indicated in FIGS. 4(a) to 4(d) is remarkably reduced. After the GaN layer 18 was formed (in the state illustrated in FIG. 3(d)), TESi being a metal used as a n-type impurity material with respect to GaN is supplied to a surface of the GaN layer 18 at a timing T1 (see FIG. 5) in accordance with a treating condition indicated in FIG. 7(b-1).

At a timing T2 (see FIG. 5) when a predetermined period of time t1 elapsed from the timing T1 (see FIG. 5), a supply of TESi onto the surface 14a of the GaN buffer layer 14 is finished, and at the same time, a supply of trimethylgallium (TMG) and ammonia (NH$_3$) is started in accordance with a treating condition indicated in FIG. 7(b-2) to form a GaN layer 20 through an interface treated by supplying the TESi on the GaN layer 18 (see FIG. 7(a)).

In also the GaN layer 20 (1 nm film thickness) formed as described above, a defect density of structural defects, particularly a dislocation density of threading dislocations is remarkably reduced by the action of TESi being a structural defect suppressing material described above as in the case of the GaN layer 18.

Namely, according to the second embodiment of a method for the formation of semiconductor layers of the present invention, a supply of a structural defect suppressing material (TESi) as well as a supply of trimethylgallium (TMG) and ammonia (NH$_3$) are repeated on the surface of a semiconductor layer (GaN layer 18) formed, whereby a plurality of layers of the GaN layer 18 and the GaN layer 20 being semiconductor layers can be laminated.

A third embodiment of a method for the formation of semiconductor layers according to the present invention will be described hereinafter by referring to FIGS. 8(a) and 8(b).

FIGS. 8(a-1) and 8(a-2) illustrate schematically each state wherein a GaN thin film (films) as a semiconductor layer (layers) is (are) formed in a time-series order in accordance with the third embodiment of a method for the formation of a semiconductor layer (layers) of the present invention. In the third embodiment, the state shown in FIG. 8(a-1) shifts to the state shown in FIG. 8(b-2).

It is to be noted that the state shown in FIG. 8(a-1) corresponds to the state shown in FIG. 3(b), and the state shown in FIG. 8(a-2) corresponds to the state shown in FIG. 3(d), respectively.

Furthermore, a treating condition in case of forming a thin film structure shown in FIG. 8 (a-2) in accordance with MOCVD process is indicated in FIG. 8(b).

When the third embodiment of a method for the formation of semiconductor layers according to the present invention is compared with the first embodiment of a method for the formation of a semiconductor layer according to the present invention, only TESi is supplied on the surface 14a of the GaN buffer layer 14 in the above describe first embodiment of a method for the formation of a semiconductor layer of the present invention (see FIG. 3(b) and FIG. 4(c)), while TESi is supplied on the surface 14a of the GaN buffer layer 14 as well as light beam is also supplied thereon in the third embodiment of a method for the formation of semiconductor layers of the invention.

More specifically, TESi is supplied on the surface 14a of the GaN buffer layer 14 being a buffer layer formed as in the case of the first embodiment of a method for the formation of a semiconductor layer of the present invention as well as light beam is applied from a mercury lamp thereon.

Accordingly, since treating conditions and the like (see FIGS. 4(a) and 4(b)) in a course wherein an AlN (aluminum nitride) thin film 12 is formed as a buffer layer on a 6H—SiC (0001) substrate 10 as a substrate, and thereafter, a GaN buffer layer 14 is formed as another buffer layer on the AlN thin film 12 (see FIG. 3(a)) are the same as those described in the explanation for operations in the aforesaid first embodiment of a method for the formation of a semiconductor layer of the invention, the detailed description therefor are omitted by quoting the corresponding description.

Namely, TESI is supplied (see FIG. 8(a-1)) on a surface of the GaN buffer layer 14 (see FIG. 3(a)) formed in accordance with the treating conditions indicated in FIGS. 4(a) and 4(b) at a timing T1 (see FIG. 5) in accordance with the treating condition indicated in FIG. 8(b).

In this case, light beam is continuously output on the surface 14a of the GaN buffer layer 14 from a mercury lamp at 0.1 pJ/cm$^2$ intensity at the same time of a supply of TESi, so that surface diffusion of Si in TESi on the surface 14a of the GaN buffer layer 14 is promoted as a result of application of light beam from the mercury lamp.

For this reason, Si in TESi is easily adsorbed at a dislocation core position on the surface 14a of the GaN buffer layer 14, so that reforming of the surface 14a of the GaN buffer layer 14 in atomic level is more promoted.

At a timing T2 (see FIG. 5) when a predetermined period of time t1 (see FIG. 5) elapsed from the timing T1 (see FIG. 5), a supply of TESi onto the surface 14a of the GaN buffer layer 14 is finished, and at the same time, a supply of trimethylgallium (TMG) and ammonia (NH$_3$) is started in accordance with a treating condition indicated in FIG. 4(d) to form a GaN layer 18 through an interface (see FIG. 8 (a-2)) treated by supplying the TESi on the GaN buffer layer 14 under application of light beam from mercury lamp (see FIG. 8(a-2)).

In the GaN layer 18 (1 nm film thickness) formed as described above, a defect density of structural defects, particularly a dislocation density of threading dislocations is remarkably reduced by the action of TESi being a structural defect suppressing material as described above.

Namely, according to the third embodiment of a method for the formation of semiconductor layers of the present invention, a defect density of structural defects, particularly a dislocation density of threading dislocations in the GaN layer 18 being a semiconductor layer can be remarkably reduced by the supply of TESi being a structural defect suppressing material, besides as a result of application of light beam by means of a mercury lamp in addition to the supply of TESi being a structural defect suppressing material, surface diffusion of Si in the TESi is promoted on the surface 14a of the GaN buffer layer 14, so that Si in the TESi is easily adsorbed at a dislocation core position on the surface 14a of the GaN buffer layer 14, whereby reforming of the surface 14a of the GaN buffer layer 14 can be more promoted in an atomic level.

In the following, a fourth embodiment of a method for the formation of semiconductor layers according to the present invention will be described by referring to FIGS. 9(a) and 9(b).

FIGS. 9 (a-1) and 9(a-2) illustrate schematically each state wherein a GaN thin film (films) as a semiconductor layer (layers) is (are) formed in a time-series order in accordance with the fourth embodiment of a method for the formation of a semiconductor layer (layers) of the present invention. In the fourth embodiment, the state shown in FIG. 9 (a-1) shifts to the state shown in FIG. 9(b-2).

It is to be noted that the state shown in FIG. 9(a-1) corresponds to the state shown in FIG. 3(b), and the state shown in FIG. 9(a-2) corresponds to the state shown in FIG. 3(d), respectively.

Furthermore, a treating condition in case of forming a thin film structure shown in FIG. 9 (a-2) in accordance with MOCVD process is indicated in FIG. 9(b).

When the fourth embodiment of a method for the formation of semiconductor layers according to the present invention is compared with the first embodiment of a method for the formation of a semiconductor layer according to the present invention, only TESi is supplied on the surface 14a of the GaN buffer layer 14 in the above described first embodiment of a method for the formation of a semiconductor layer of the present invention (see FIG. 3(b) and FIG. 4(c)), while TESi is supplied together with other types of structural defect suppressing material on the surface 14a of the GaN buffer layer 14 in the fourth embodiment of a method for the formation of semiconductor layers of the present invention.

More specifically, TESi is supplied on the surface of a GaN buffer layer 14 being a buffer layer formed similarly as in the first embodiment of a method for the formation of a semiconductor layer according to the present invention as well as TMIn is also supplied thereon.

Accordingly, since treating conditions and the like (see FIGS. 4(a) and 4(b)) in a course wherein an AlN (aluminum nitride) thin film 12 is formed as a buffer layer on a 6H—SiC (0001) substrate 10 as a substrate, and thereafter, a GaN buffer layer 14 is formed as another buffer layer on the AlN thin film 12 (see FIG. 3(a)) are the same as those described in the explanation for operations in the aforesaid first embodiment of a method for the formation of a semiconductor layer of the invention, the detailed description therefor are omitted by quoting the corresponding description.

Namely, TESi is supplied (see FIG. 7(a-1)) on a surface of the GaN buffer layer 14 (see FIG. 3(a)) formed in accordance with the treating conditions indicated in FIGS. 4(a) and 4(b) at a timing T1 (see FIG. 5) according to the treating condition indicated in FIG. 9(b).

In this case, TMIn is supplied on the surface 14a of the GaN buffer layer 14 together with a supply of TESi, so that surface diffusion of Si in TESi on the surface 14a of the GaN buffer layer 14 is promoted as a result of supplying In in the TMIn.

For this reason, Si in TESi is easily adsorbed at a dislocation core position on the surface 14a of the GaN buffer layer 14, so that reforming of the surface 14a of the GaN buffer layer 14 in atomic level is more promoted.

At a timing T2 (see FIG. 5) when a predetermined period of time t1 (see FIG. 5) elapsed from the timing T1 (see FIG. 5), a supply of TESi onto the surface 14a of the GaN buffer layer 14 is finished, and at the same time, a supply of trimethylgallium (TMG) and ammonia ($NH_3$) is started in accordance with a treating condition indicated in FIG. 4(d) to form a GaN layer 18 through an interface (see FIG. 9(a-2)) treated by supplying the TESi together with the TMIn on the GaN buffer layer 14 (see FIG. 7(a-2)).

In the GaN layer 18 (1 nm film thickness) formed as described above, a defect density of structural defects, particularly a dislocation density of threading dislocations is remarkably reduced by the action of TESi being a structural defect suppressing material as described above.

Namely, according to the fourth embodiment of a method for the formation of semiconductor layers of the present invention, a defect density of structural defects, particularly a dislocation density of threading dislocations in the GaN layer 18 being a semiconductor layer is remarkably reduced by the supply of TESi being a structural defect suppressing material, besides as a result of supplying TMIn in addition to the supply of TESi being a structural defect suppressing material, surface diffusion of Si in the TESi is promoted on the surface 14a of the GaN buffer layer 14, so that Si in the TESi is easily adsorbed at a dislocation core position on the surface 14a of the GaN buffer layer 14, whereby reforming of the surface 14a of the GaN buffer layer 14 can be more promoted in an atomic level.

In the following, a fifth embodiment of a method for the formation of semiconductor layers according to the present invention will be described by referring to FIGS. 10(a) and 10(b).

Figure 10A:
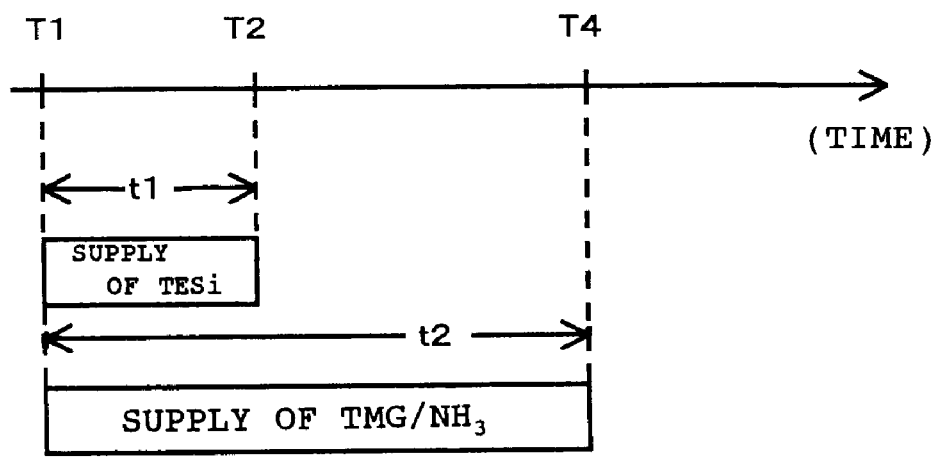
FIG. 10(*a*) is an explanatory diagram indicating timing for supplying TESi and a gas for forming GaN thin films as semiconductor layers in accordance with a fifth embodiment of a method for the formation of semiconductor layers according to the present invention, and FIG. 10(*b*) is an explanatory view illustrating schematically a state wherein a GaN thin films are formed as semiconductor layers in accordance with the fifth embodiment of a method for the formation of semiconductor layers according to the present invention.
Figure 10B:
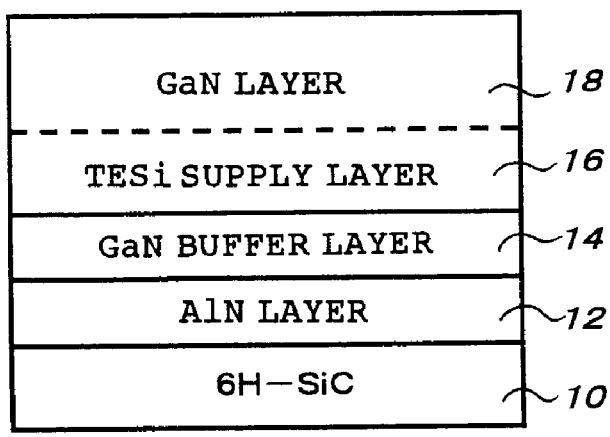

FIG. 10(a) is an explanatory diagram showing a timing for supplying TESi as well as a timing for supplying gases for forming a GaN thin film as a semiconductor layer in accordance with the fifth embodiment of a method for the formation of semiconductor layers of the present invention, and FIG. 10(b) illustrates schematically a state wherein a GaN thin film as a semiconductor layer in accordance with the fifth embodiment of a method for the formation of semiconductor layers of the invention.

When the fifth embodiment of a method for the formation of semiconductor layers of the invention is compared with the first embodiment of a method for the formation of semiconductor layers according to the present invention, a supply of TESi is made at a different timing from that of a supply of trimethylgallium (TMG) and ammonia ($NH_3$) for forming a GaN layer 18 in the first embodiment of a method for the formation of semiconductor layers of the invention (see FIG. 5), while a supply of TESi is made at the same timing as that of a supply of trimethylgallium (TMG) and ammonia ($NH_3$) for forming a GaN layer 18 in the fifth embodiment of a method for the formation of semiconductor layers of the invention.

Since treating conditions and the like (see FIGS. 4(a) and 4(b)) in a course wherein an AlN (aluminum nitride) thin film 12 is formed as a buffer layer on a 6H—SiC (0001) substrate 10 as a substrate, and thereafter, a GaN buffer layer 14 is formed as another buffer layer on the AlN thin film 12 (see FIG. 3(a)) are the same as those described in the explanation for operations in the aforesaid first embodiment of a method for the formation of a semiconductor layer of the invention, the detailed description therefor are omitted by quoting the corresponding description.

More specifically, a start of supplying TESi (see the timing T1 in FIG. 5) is different in timing from that of supplying trimethylgallium (TMG) and ammonia ($NH_3$) for forming the GaN layer 18 (see the timing T2 in FIG. 5) as described above in the first embodiment of a method for the formation of a semiconductor layer of the invention, so that there is no case where TESi being a structural defect suppressing material as well as trimethylgallium (TMG) and ammonia ($NH_3$) for forming the GaN layer 18 are supplied at the same timing.

On the other hand, in the fifth embodiment of a method for the formation of semiconductor layers of the invention, a supply of TESi onto a surface 14a of the GaN buffer layer 14 is started at a timing T1 (see FIG. 10(a)) in accordance with the treating condition indicated in FIG. 4(c), and at the same time, a supply of trimethylgallium (TMG) and ammonia ($NH_3$) for forming the GaN layer 18 is started according to the treating condition indicated in FIG. 4(d).

At a timing T2 (see FIG. 10(a)) when a predetermined period of time t1 (see FIG. 10(a)) elapsed from the timing T1 (see FIG. 10(a)), a supply of TESi onto the surface 14a of the GaN buffer layer 14 is finished.

On one hand, at a timing T4 (see FIG. 10(a)) when a predetermined period of time t2 (see FIG. 10(a)) elapsed from the timing T1 (see FIG. 10(a)), a supply of trimethylgallium (TMG) and ammonia ($NH_3$) for forming the GaN layer 18 is finished.

Thus, TESi as well as trimethylgallium (TMG) and ammonia ($NH_3$) for forming the GaN layer 18 are supplied on the surface 14a of the GaN buffer layer 14 at the same timing.

As a result, both TESi as well as trimethylgallium (TMG) and ammonia ($NH_3$) for forming the GaN layer 18 are supplied during a predetermined period of time t1 extending from the timing T1 to the timing T2, so that a TESi supply layer 16 containing TESi is formed.

Furthermore, only trimethylgallium (TMG) and ammonia ($NH_3$) for forming the GaN layer 18 are supplied during a period of time extending from the timing T2 at the time when the supply of TESi was finished to the timing T4, so that the GaN layer 18 is formed on a surface of the TESi supply layer 16 (see FIG. 10(c)).

In the GaN layer 18 (1 nm film thickness) formed as described above, a defect density of structural defects, particularly a dislocation density of threading dislocations is remarkably reduced by the action of TESi being a structural defect suppressing material as described above.

Namely, according to the fifth embodiment of a method for the formation of semiconductor layers of the present invention, a defect density of structural defects, particularly a dislocation density of threading dislocations in the GaN layer 18 being a semiconductor layer can be remarkably reduced by a simultaneous supply of TESi being a structural defect suppressing material with trimethylgallium (TMG) and ammonia ($NH_3$) for forming the GaN layer 18 being a semiconductor layer.

In the following, a sixth embodiment of a method for the formation of semiconductor layers according to the present invention will be described by referring to FIG. 11(a).

FIG. 11(a) illustrates schematically a state wherein GaN thin films are formed as semiconductor layers in accordance with the sixth embodiment of a method for the formation of semiconductor layers of the invention.

When the sixth embodiment of a method for the formation of semiconductor layers according to the present invention is compared with the fifth embodiment of a method for the formation of a semiconductor layer according to the present invention, only single layer each of the TESi supply layer 16 and the GaN layer 18 is formed (see FIG. 10(b)) in the above described fifth embodiment of a method for the formation of a semiconductor layer of the present invention, while a plurality each of the TESi supply layers 16 and the GaN layers 18 are formed by laminating these plurality of layers, respectively, in the sixth embodiment of a method for the formation of semiconductor layers of the invention.

Since treating conditions and the like (see FIGS. 4(a) through 4(d)) in a course wherein an AlN (aluminum nitride) thin film 12 is formed as a buffer layer on a 6H—SiC (0001) substrate 10 as a substrate, thereafter, a GaN buffer layer 14 is formed as another buffer layer on the AlN thin film 12, and further a TESi supply layer 16 and a GaN layer 18 are formed on a surface 14a of the GaN buffer layer 14 are the same as those described in the explanation for operations in the aforesaid fifth embodiment of a method for the formation of a semiconductor layer of the invention, the detailed description therefor are omitted by quoting the corresponding description.

Onto a surface of the GaN buffer layer 18 is started a supply of TESi at a timing T1 (see FIG. 10(a)) in accordance with the treating condition indicated in FIG. 7(b-1), and at the same time, a supply of trimethylgallium (TMG) and ammonia ($NH_3$) for forming a GaN layer 18' is started according to the treating condition indicated in FIG. 7(b-2).

At a timing T2 (see FIG. 10(a)) when a predetermined period of time t1 (see FIG. 10(a)) elapsed from the timing T1 (see FIG. 10(a)), a supply of TESi onto the surface 14a of the GaN buffer layer 14 is finished.

On one hand, at a timing T4 (see FIG. 10(a)) when a predetermined period of time t2 (see FIG. 10(a)) elapsed from the timing T1 (see FIG. 10(a)), a supply of trimethylgallium (TMG) and ammonia ($NH_3$) for forming the GaN layer 18' is finished.

As a result, a TESi supply layer 16' is formed on the surface of the GaN layer 18, and the GaN layer 18' is formed on a surface of the TESi supply layer 16' (see FIG. 11(a)).

In the GaN layer 18' (1 nm film thickness) formed as described above, a defect density of structural defects, particularly a dislocation density of threading dislocations is remarkably reduced by the action of TESi being a structural defect suppressing material as described above.

Namely, according to the sixth embodiment of a method for the formation of semiconductor layers of the present invention, a supply of a structural defect suppressing material (TESi) as well as a supply of trimethylgallium (TMG) and ammonia ($NH_3$) are repeated on the surface of a semiconductor layer (GaN layer 18) formed, whereby a plurality of layers of the GaN layer 18 and the GaN layer 18' being semiconductor layers can be laminated.

A seventh embodiment of a method for the formation of semiconductor layers according to the present invention will be described hereinafter by referring to FIG. 11(b).

FIGS. 11(b-1) and 11(b-2) illustrate schematically each state wherein a GaN thin film (films) as a semiconductor layer (layers) is (are) formed in a time-series order in accordance with the seventh embodiment of a method for the formation of a semiconductor layer (layers) of the present invention. In the seventh embodiment, the state shown in FIG. 11(b-1) shifts to the state shown in FIG. 11(b-2).

When the seventh embodiment of a method for the formation of semiconductor layers according to the present invention is compared with the fifth embodiment of a method for the formation of a semiconductor layer according to the present invention, only TESi as well as trimethylgallium (TMG) and ammonia ($NH_3$) for forming the GaN layer 18 are supplied on the surface 14a of the GaN buffer layer 14 at the same time in the above described fifth embodiment of a method for the formation of a semiconductor layer of the present invention, while TESi as well as trimethylgallium (TMG) and ammonia ($NH_3$) for forming a GaN layer 18 are supplied on a surface 14a of a GaN buffer layer 14 at the same time, besides light beam is also applied thereon in the seventh embodiment of a method for the formation of semiconductor layers of the invention.

More specifically, TESi as well as trimethylgallium (TMG) and ammonia ($NH_3$) for forming the GaN layer 18 are supplied on a surface 14a of a GaN buffer layer 14 being a buffer layer formed as in the case of the first embodiment of a method for the formation of a semiconductor layer of the present invention, besides light beam is applied from a mercury lamp thereon.

Accordingly, since treating conditions and the like (see FIGS. 4(a) and 4(b)) in a course wherein an AlN (aluminum initride) thin film 12 is formed as a buffer layer on a 6H—SiC (0001) substrate 10 as a substrate, and thereafter, a GaN buffer layer 14 is formed as another buffer layer on the AlN thin film 12 (see FIG. 3(a)) are the same as those described in the explanation for operations in the aforesaid first embodiment of a method for the formation of a semiconductor layer of the invention, the detailed description therefor are omitted by quoting the corresponding description.

Namely, a supply of TESi onto the surface of the GaN buffer layer 14 (see FIG. 3(a)) is started at a timing T1 (see FIG. 10(a)) in accordance with the treating condition indicated in FIG. 8(b), and at the same time, a supply of trimethylgallium (TMG) and ammonia ($NH_3$) for forming the GaN layer 18 is started according to the treating condition indicated in FIG. 4(d).

In this case, light beam is continuously output on the surface 14a of the GaN buffer layer 14 from a mercury lamp at 0.1 pJ/$cm^2$ intensity at the same time of a supply of TESi as well as trimethylgallium (TMG) and ammonia ($NH_3$) for forming the GaN layer 18, so that surface diffusion of Si in TESi on the surface 14a of the GaN buffer layer 14 is promoted as a result of application of light beam from the mercury lamp.

For this reason, Si in TESi is easily adsorbed at a dislocation core position on the surf ace 14a of the GaN buffer layer 14, so that reforming of the surface 14a of the GaN buffer layer 14 is more promoted in atomic level.

At a timing T2 (see FIG. 10(a)) when a predetermined period of time t1 (see FIG. 10(a)) elapsed from the timing T1 (see FIG. 10(a)), a supply of TESi onto the surface 14a of the GaN buffer layer 14 is finished.

On the other hand, a supply of trimethylgallium (TMG) and ammonia ($NH_3$) for forming the GaN layer 18 is finished at a timing T4 (see FIG. 10(a)) when a predetermined period of time t2 (see FIG. 10(a)) elapsed from the timing T1 (see FIG. 10(a)).

In the GaN layer 18 (1 nm film thickness) formed as described above, a defect density of structural defects, particularly a dislocation density of threading dislocations is remarkably reduced by the action of TESi being a structural defect suppressing material as described above.

Namely, according to the seventh embodiment of a method for the formation of semiconductor layers of the present invention, a defect density of structural defects, particularly a dislocation density of threading dislocations in the GaN layer 18 being a semiconductor layer can be remarkably reduced by the simultaneous supply of TESi being a structural defect suppressing material with trimethylgallium (TMG) and ammonia ($NH_3$) for forming the GaN layer 18, besides as a result of application of light beam by means of a mercury lamp in addition to the simultaneous supply of TESi being a structural defect suppressing material with trimethylgallium (TMG) and ammonia ($NH_3$) for forming the GaN layer 18, surface diffusion of Si in the TESi is promoted on the surface 14a of the GaN buffer layer 14, so that Si in the TESI is easily adsorbed at a dislocation core position on the surface 14a of the GaN buffer layer 14, whereby reforming of the surface 14a of the GaN buffer layer 14 can be more promoted in an atomic level.

In the following, a eighth embodiment of a method for the formation of semiconductor layers according to the present invention will be described by referring to FIG. 11(c).

FIGS. 11(c-1) and 11(c-2) illustrate schematically each state wherein a GaN thin film (films) as a semiconductor layer (layers) is (are) formed in a time-series order in accordance with the eighth embodiment of a method for the formation of a semiconductor layer (layers) of the present invention in which the state shown in FIG. 11(c-1) shifts to the state shown in FIG. 11(c-2).

When the eighth embodiment of a method for the formation of semiconductor layers according to the present invention is compared with the seventh embodiment of a method for the formation of a semiconductor layer according to the present invention, only TESi as well as trimethylgallium (TMG) and ammonia ($NH_3$) for forming the GaN layer 18 are supplied on the surface 14a of the GaN buffer layer 14 at the same time in the above described seventh embodiment of a method for the formation of a semiconductor layer of the present invention, while TESi as well as trimethylgallium (TMG) and ammonia ($NH_3$) for forming a GaN layer 18 are supplied on a surface 14a of a GaN buffer layer 14 at the same time, besides another type of a structural defect suppressing material is also supplied thereon in the eighth embodiment of a method for the formation of semiconductor layers of the invention.

More specifically, TESi as well as trimethylgallium (TMG) and ammonia ($NH_3$) for forming a GaN layer 18 are supplied on the surface 14a of a GaN buffer layer 14 being a buffer layer formed similarly as in the first embodiment of a method for the formation of a semiconductor layer according to the present invention, besides TMIn is also supplied thereon.

Accordingly, since treating conditions and the like (see FIGS. 4(a) and 4(b)) in a course wherein an AlN (aluminum nitride) thin film 12 is formed as a buffer layer on a 6H—SiC (0001) substrate 10 as a substrate, and thereafter, a GaN buffer layer 14 is formed as another buffer layer on the AlN thin film 12 (see FIG. 3(a)) are the same as those described in the explanation for operations in the aforesaid first embodiment of a method for the formation of a semiconductor layer of the invention, the detailed description therefor are omitted by quoting the corresponding description.

Namely, a supply of TESi and TMIn is started on a surface of the GaN buffer layer 14 (see FIG. 3(a)) formed in accordance with the treating conditions indicated in FIGS. 4(a) and 4(b) at a timing T1 (see FIG. 10(a)) in accordance with the treating condition indicated in FIG. 9(b) as well as a supply of trimethylgallium (TMG) and ammonia ($NH_3$) for forming a GaN layer 18 is also started in accordance with the treating condition indicated in FIG. 4(d) thereon.

In this case, TMIn is supplied on the surface 14a of the GaN buffer layer 14 together with TESi as well as a supply of trimethylgallium (TMG) and ammonia ($NH_3$) for forming the GaN layer 18, so that surface diffusion of In in TMIn on the surface 14a of the GaN buffer layer 14 is promoted.

For this reason, Si in TESi is easily adsorbed at a dislocation core position on the surface 14a of the GaN buffer layer 14, so that reforming of the surface 14a of the GaN buffer layer 14 is more promoted in atomic level.

At a timing T2 (see FIG. 10(a)) when a predetermined period of time t1 (see FIG. 10(a)) elapsed from the timing T1 (see FIG. 10(a)), a supply of TESi and TMIn onto the surface 14a of the GaN buffer layer 14 is finished.

On the other hand, a supply of trimethylgallium (TMG) and ammonia ($NH_3$) for forming the GaN layer 18 is finished at a timing T4 (see FIG. 10(a)) when a predetermined period of time t2 (see FIG. 10(a)) elapsed from the timing T1 (see FIG. 10(a)).

In the GaN layer 18 (1 nm film thickness) formed as described above, a defect density of structural defects, particularly a dislocation density of threading dislocations is remarkably reduced by the action of TESi being a structural defect suppressing material as described above.

Namely, according to the eighth embodiment of a method for the formation of semiconductor layers of the present invention, a defect density of structural defects, particularly a dislocation density of threading dislocations in the GaN layer 18 being a semiconductor layer can be remarkably reduced by the simultaneous supply of TESi being a structural defect suppressing material with trimethylgallium (TMG) and ammonia ($NH_3$) for forming the GaN layer 18, besides as a result of supplying TMIn in addition to the simultaneous supply of TESi being a structural defect suppressing material with trimethylgallium (TMG) and ammonia ($NH_3$) for forming the GaN layer 18, surface diffusion of Si in the TESi is promoted on the surface 14a of the GaN buffer layer 14, so that Si in the TESi is easily adsorbed at a dislocation core position on the surface 14a of the GaN buffer layer 14, whereby reforming of the surface 14a of the GaN buffer layer 14 can be more promoted in an atomic level.

It is to be noted that the above described embodiments may be modified as explained in the following paragraphs (1) through (10).

(1) While a GaN layer 18 has been grown in 1 nm film thickness to form a GaN thin film in the above described embodiments, the invention is not limited thereto as a matter of course, but a variety of treating conditions may be modified, for instance, a growth period of time may be changed to form the GaN layer 18 into a thick film or a bulk.

(2) In the above described embodiments, both of a GaN buffer layer 14 being a buffer layer and a GaN layer 18 being a semiconductor layer have been GaN layers, and in other words, the buffer layer and the semiconductor layer are made from a homogeneous material. However, the present invention is not limited thereto, but the buffer layer and the semiconductor layer may be made from a heterogeneous material as a matter of course, for instance, a formation of an AlGaN layer as a buffer layer as well as that of a GaN layer 18 as a semiconductor layer are applicable.

(3) Although MOCVD process has been applied as a method for preparing a thin film in the above described embodiments, the present invention is not limited thereto as a matter of course, but a variety of thin film preparing technologies may be applied, for example, they are the thin film preparing technologies other than MOCVD as shown in FIG. 12(a) such as MBE (Molecular Beam Epitaxy), CBE (Chemical Beam Epitaxy), HAVPE (Halide Vapor Phase Epitaxy), GSMBE (Gas-Source Molecular Beam Epitaxy), MOMBE (Metalorganic MBE), LPE (Liquid Phase Epitaxy), CVD (Chemical Vapor Deposition), sputtering, and vacuum deposition processes.

For instance, in case of applying GSMBE process, a GaN thin film is formed in accordance with the treating condition indicated in FIG. 13, while, in also another process for preparing a thin film, various treating conditions and the like may be modified in accordance with the corresponding thin film preparing process.

(4) While in the above described embodiments, 6H—SiC (0001) has been used as a substrate, Si in TESi has been supplied as a structural defect suppressing material, and a semiconductor layer to be formed wherein structural defects had been reduced has been a GaN layer, the present invention is not limited thereto as a matter of course, but as a substrate, silicon carbide substrate (6H—SiC substrate, 4H—SiC substrate), laminated substrate of silicon carbide and silicon (SiC/Si substrate), silicon substrate (Si substrate), sapphire substrate ($Al_2O_3$ substrate), laminated substrate of zinc oxide and sapphire ($ZnO/Al_2O_3$ substrate), germanium substrate (Ge substrate), gallium arsenide substrate (GaAs substrate), indium arsenide substrate (InAs substrate), gallium phosphide substrate (GaP substrate), indium phosphide substrate (InP substrate), or spinel substrate ($MgAl_2O_3$, $LiGaO_2$) may be used (see FIG. 12(b)). As a structural defect suppressing material, H (hydrogen) of the group I-A; Be (beryllium), or Mg (magnesium) of the group II-A; Al (aluminum), Ga (gallium), or In (indium) of the group III-B; C (carbon), Si (silicon), Ge (germanium), or Sn (tin) of the group IV-B; N (nitrogen), P (phosphorus), As (arsenic), or Sb (antimony); or O (oxygen), S (sulfur), Se (selenium), or Te (tellurium) of the group V-B in periodic table may be used (see FIG. 12(c)). A semiconductor layer to be formed wherein structural defects are reduced may be a layer of a semiconductor C (diamond), Si (silicon), Ge (germanium), SiC, SiGe, or SiCGe of the group IV; that of a binary system semiconductor of BN, AlN, GaN, InN, BP, AlP, GaP, InP, BAs, AlAs, GaAs, or InAs of the groups III–V; that of a ternary system mixed crystal semiconductor BAlN, BGaN, BInN, AlGaN, AlInN, GaInN, BAlP, BGaP, BInP, AlGaP, AlInP, GaInP, BAlAs, BGaAs, BInAs, AlGaAs, AlInAs, GaInAs, BNP, BNAs, BPAs, AlNP, AlNAs, AlPAs, GaNP, GaNAs, GaPAs, InNP, InNAs, or InPAs of the groups III–V; that of a quaternary system mixed crystal semiconductor BAlGaN, BAlInN, BGaInN, AlGaInN, BAlGaP, BAlInP, BGaInP, AlGaInP, BAlGaAs, BAlInAs, BGaInAs, AlGaInAs, BAlNP, BGaNP, BInNP, AlGaNP, AlInNP, GaInNP, BAlNAs, BGaNAs, BInNAs, AlGaNAs, AlInNAs, GaInNAs, BAlPAs, BGaPAs, BInPAs, AlGaPAs, AlInPAs, GaInPAs, BNPAS, AlNPAs, GaNPAs, or InNPAs of the groups III–V; or that of a semiconductor of ZnO, ZnS, ZnSe, ZnTe, CdO, CdS, CdSe, CdTe, ZnCdO, ZnCdS, ZnCdSe, ZnCdTe, ZnOS, ZnOSe, ZnOTe, ZnSSe, ZnSTe, ZnSeTe, CdOS, CdOSe, CdOTe, CdSSe, CdSTe, CdSeTe, ZnCdOS, ZnCdOSe, ZnCdOTe, ZnCdSSe, ZnCdSTe, ZnCdSeTe, ZnOSSe, ZnOSTe, ZnOSeTe, ZnSSeTe, CdOSSe, CdOSTe, CdOSeTe, or CdSSeTe of the groups II–VI in periodic table (see FIG. 12(d))

In this case, a material (or materials) for forming a semiconductor layer (layers) may be supplied in accordance with the semiconductor layer (layers) to be formed.

(5) Although a semiconductor layer to be formed wherein structural defects had been reduced has been a GaN layer prepared from trimethylgallium (TMG) or ammonia ($NH_3$) in the above described embodiments of a method for the formation of a semiconductor layer (layers) according to the present invention, the invention is not limited thereto as a matter of course, but it may be a GaN layer prepared from solid gallium (Ga), trimethyl gallium (TMG), ortriethylgallium (TEG) and nitrogen radical, ammonia ($NH_3$), monomethylhydrazine (MMHy), or dimethylhydrazine (DMHy); an AlGaN layer prepared from solid gallium (Ga), trimethyl gallium (TMG), or triethylgallium and solid aluminum (Al), trimethylaluminum (TMA), triethylaluminum (TEA), trimethylaminealum (TMAAl), dimethylethylaminealum (DMEAAl), or triisobutylaluminum (TIBAl) and further, nitrogen radical, ammonia ($NH_3$), monomethylhydrazine (MMHy), or dimethylhydrazine (DMHy); or an AlN layer prepared from a solid aluminum (Al), trimethylaluminum (TEA), triethylaluminum (TEA), trimethylaminealum (TMAAl), dimethylethylaminealum (DMEAAl), or triisobutylaluminum (TIBAl) and nitrogen radical, ammonia ($NH_3$), monomethylhydrazine (MMHy), or dimethylhydrazine (DMHy) (see FIG. 14(a)).

(6) While tetraethylsilane (TESi) has been used for supplying Si as a structural defect suppressing material in the above described embodiments of a method for the formation of a semiconductor layer (layers) according to the present invention, the invention is not limited thereto as a matter of course, but solid silicon (Si), silane ($SiH_4$), disilane ($Si_2H_6$), methylsilane ($CH_3SiH_3$), dimethylsilane (($CH_3)_2SiH_2$), diethylsilane (($C_2H_5)_2SiH_2$), trimethylsilane (($CH_3)_3SiH$), triethylsilane(($C_2H_5)_3SiH$) or tetramethylsilane (TMSi) may be used for a supply of Si (see FIG. 14(b)).

(7) Although only one layer of a GaN layer 18' or 20 has been laminated on a surface of the GaN layer 18 as a semiconductor layer in the above described second and the sixth embodiments of a method for the formation of a semiconductor layer according to the present invention (see FIG. 7(a) and FIG. 11(a)), the invention is not limited thereto as a matter of course, but two or more semiconductor layers may be laminated on the surface of the GaN layer 18 as a semiconductor layer.

(8) While TESi has been supplied onto the surface 14a of the GaN buffer layer 14 and at the same time, light beam has been output thereon by the use of a mercury lamp in the above described third and seventh embodiments of a method for the formation of a semiconductor layer according to the present invention (see FIG. 8 and FIG. 11(b)), the invention is not limited thereto as a matter of course, but electron beam, radical beam, ion beam as well as atomic hydrogen or the like may be applied on the surface 14a of the GaN buffer layer 14 by the use of a laser (having a wavelength of 100 nm to 10 microns such as excimer laser, He—Cd laser, Ar laser, Kr laser, He—Ne laser, N2 laser, and carbon dioxide gas laser) in case of supplying a structural defect suppressing material onto the surface 14a of the GaN buffer layer 14.

(9) Although TMIn has been supplied together with TESi in the fourth and the eighth embodiments of a method for the formation of a semiconductor layer according to the present invention (see FIG. 9 and FIG. 11(c)), the invention is not limited thereto as a matter of course, but a structural defect suppressing material such as H (hydrogen) of the group I-A; Be (beryllium), or Mg (magnesium) of the group II-A; Al (aluminum), Ga (gallium), or In (indium) of the group III-B; C (carbon), Si (silicon), Ge (germanium), or Sn (tin) of the group IV-B; or N (nitrogen), P (phosphorus), As (arsenic), or Sb (antimony) of the group V-B; or at least two types of structural defect suppressing materials of O (oxygen), S (sulfur), Se (selenium), and Te (tellurium) of the group VI-B in periodic table may be supplied to the surface 14a of the GaN buffer layer 14 in the form of atom or compound.

(10) The above described embodiments as well as the modifications enumerated in the above described paragraphs (1) through (9) may suitably be combined in the present invention.

Since the present invention has been constituted as mentioned above, such excellent advantages that a defect density of structural defects, particularly a dislocation density of threading dislocations in the resulting semiconductor layer can be remarkably reduced, so that reduction of hours of work can be realized as well as that a manufacturing cost can be reduced without requiring any complicated process in case of forming a thin or thick film semiconductor layer (layers) made of GaN or the like on a substrate made of a variety of materials are achieved.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 11-354563 filed on Dec. 14, 1999 including specification, claims, drawings and summary are incorporated herein by reference in its entirety.

What is claimed is:

1. A method for the formation of a semiconductor layer in which a GaN layer or an AlGaN layer is formed on an SiC substrate or an $Al_2O_3$ substrate by means of MOCVD (Metalorganic Chemical Vapor Deposition) equipment comprising:

a first step for either supplying trimethylgallium (TMG) or triethylgallium (TEG) and ammonia ($NH_3$) onto a surface of the SiC substrate or the $Al_2O_3$ substrate to form a GaN layer as a buffer layer, or supplying trimethylgallium (TMG) or triethylgallium (TEG) and trimethylaluminum (TMA) or triethylaluminum (TEA) and ammonia ($NH_3$) thereon to form an AlGaN layer as a buffer layer;

a second step for supplying Si being an n-type impurity material used in a GaN layer or an AlGaN layer on a surface of the GaN layer or the AlGaN layer being said buffer layer formed in said first step by means of silane ($SiH_4$), disilane ($Si_2H_6$), or tetraethylsilane (TESi) in one monolayer or less; and a third step for either supplying trimethylgallium (TMG) or triethylgallium (TEG) and ammonia ($NH_3$) on a surface of the GaN layer or the AlGaN layer being said buffer layer to which has been supplied said silane ($SiH_4$), disilane ($Si_2H_6$), or tetraethylsilane (TESi) in said second step to form a GaN layer in a thickness of 1 nm or thicker, or supplying trimethylgallium (TMG) or triethylgallium (TEG) and trimethylaluminum (TMA) or triethylaluminum (TEA) and ammonia ($NH_3$) to form a AlGaN layer in a thickness of 1 nm or thicker.

2. The method for the formation of a semiconductor layer as claimed in claim 1, wherein at least one of a laser beam, electron beam, radical beam, ion beam, or atomic hydrogen is applied in said second step.

3. The method for the formation of a semiconductor layer as claimed in claim 1, wherein said second step supplies at least one of H (hydrogen) of the group I-A; Be (beryllium), or Mg (magnesium) of the group II-A; Al (aluminum), Ga (gallium), or In (indium) of the group III-B; C (carbon), Ge (germanium), or Sn (tin) of the group IV-B; N (nitrogen), P (phosphorous), As (arsenic), or Sb (antimony) of the group V-B; and O (oxygen), S (sulfur), Se (selenium), and Te (tellurium) of the group VI-B of the periodic table, together with supplying said Si on the surface of the GaN layer or the AlGaN layer being said buffer layer formed in said first step.

4. The method for the formation of a semiconductor layer as claimed in claim 2, wherein said second step supplies at least one of H (hydrogen) of the group I-A; Be (beryllium), or Mg (magnesium) of the group II-A; Al (aluminum), Ga (gallium), or In (indium) of the group III-B; C (carbon), Ge (germanium), or Sn (tin) of the group IV-B; N (nitrogen), P (phosphorous), As (arsenic), or Sb (antimony) of the group V-B; and O (oxygen), S (sulfur), Se (selenium), and Te (tellurium) of the group VI-B of the periodic table, together with supplying said Si on the surface of the GaN layer or the AlGaN layer being said buffer layer formed in said first step.

* * * * *